US009431068B2

(12) United States Patent
Clark et al.

(10) Patent No.: US 9,431,068 B2
(45) Date of Patent: Aug. 30, 2016

(54) DYNAMIC RANDOM ACCESS MEMORY (DRAM) WITH LOW VARIATION TRANSISTOR PERIPHERAL CIRCUITS

(71) Applicant: MIE Fujitsu Semiconductor Limited, Kuwana (JP)

(72) Inventors: Lawrence T. Clark, Phoenix, AZ (US); Lucian Shifren, San Jose, CA (US); Richard S. Roy, Dublin, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/068,756

(22) Filed: Oct. 31, 2013

(65) Prior Publication Data

US 2014/0119099 A1     May 1, 2014

Related U.S. Application Data

(60) Provisional application No. 61/720,932, filed on Oct. 31, 2012.

(51) Int. Cl.
| | |
|---|---|
| *G11C 11/4074* | (2006.01) |
| *G11C 5/14* | (2006.01) |
| *H01L 27/108* | (2006.01) |

(52) U.S. Cl.
CPC ........... *G11C 5/146* (2013.01); *G11C 11/4074* (2013.01); *H01L 27/10897* (2013.01)

(58) Field of Classification Search
CPC .......... G11C 11/4074; G11C 11/4076; G11C 11/4091; G11C 11/4072; H01L 27/0222; H01L 27/10897

USPC ............. 365/149, 189.09, 189.11, 208, 207, 365/189.05, 194; 257/299, 296
See application file for complete search history.

(56) References Cited

U.S. PATENT DOCUMENTS

| | | | |
|---|---|---|---|
| 3,958,266 | A | 5/1976 | Athanas |
| 4,000,504 | A | 12/1976 | Berger |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Banerjee et al., "Compensating Non-Optical Effects using Electrically-Driven Optical Proximity Correction", Proc. of SPIE, vol. 7275, 2009.

(Continued)

*Primary Examiner* — Andrew Q Tran
(74) *Attorney, Agent, or Firm* — Baker Botts L.L.P.

(57) ABSTRACT

A dynamic random access memory (DRAM) can include at least one DRAM cell array, comprising a plurality of DRAM cells, each including a storage capacitor and access transistor; a body bias control circuit configured to generate body bias voltage from a bias supply voltage, the body bias voltage being different from power supply voltages of the DRAM; and peripheral circuits formed in the same substrate as the at least one DRAM array, the peripheral circuits comprising deeply depleted channel (DDC) transistors having bodies coupled to receive the body bias voltage, each DDC transistor having a screening region of a first conductivity type formed below a substantially undoped channel region.

3 Claims, 13 Drawing Sheets

(56) References Cited

U.S. PATENT DOCUMENTS

| | | | |
|---|---|---|---|
| 4,021,835 | A | 5/1977 | Etoh et al. |
| 4,242,691 | A | 12/1980 | Kotani et al. |
| 4,276,095 | A | 6/1981 | Beilstein, Jr. et al. |
| 4,315,781 | A | 2/1982 | Henderson |
| 4,518,926 | A | 5/1985 | Swanson |
| 4,559,091 | A | 12/1985 | Allen et al. |
| 4,578,128 | A | 3/1986 | Mundt et al. |
| 4,617,066 | A | 10/1986 | Vasudev |
| 4,662,061 | A | 5/1987 | Malhi |
| 4,761,384 | A | 8/1988 | Neppl et al. |
| 4,780,748 | A | 10/1988 | Cunningham et al. |
| 4,819,043 | A | 4/1989 | Yazawa et al. |
| 4,885,477 | A | 12/1989 | Bird et al. |
| 4,908,681 | A | 3/1990 | Nishida et al. |
| 4,945,254 | A | 7/1990 | Robbins |
| 4,956,311 | A | 9/1990 | Liou et al. |
| 5,034,337 | A | 7/1991 | Mosher et al. |
| 5,144,378 | A | 9/1992 | Hikosaka |
| 5,156,989 | A | 10/1992 | Williams et al. |
| 5,156,990 | A | 10/1992 | Mitchell |
| 5,166,765 | A | 11/1992 | Lee et al. |
| 5,208,473 | A | 5/1993 | Komori et al. |
| 5,294,821 | A | 3/1994 | Iwamatsu |
| 5,298,763 | A | 3/1994 | Shen et al. |
| 5,369,288 | A | 11/1994 | Usuki |
| 5,373,186 | A | 12/1994 | Schubert et al. |
| 5,384,476 | A | 1/1995 | Nishizawa et al. |
| 5,426,328 | A | 6/1995 | Yilmaz et al. |
| 5,444,008 | A | 8/1995 | Han et al. |
| 5,552,332 | A | 9/1996 | Tseng et al. |
| 5,559,368 | A | 9/1996 | Hu et al. |
| 5,608,253 | A | 3/1997 | Liu et al. |
| 5,622,880 | A | 4/1997 | Burr et al. |
| 5,624,863 | A | 4/1997 | Helm et al. |
| 5,625,568 | A | 4/1997 | Edwards et al. |
| 5,641,980 | A | 6/1997 | Yamaguchi et al. |
| 5,663,583 | A | 9/1997 | Matloubian et al. |
| 5,712,501 | A | 1/1998 | Davies et al. |
| 5,719,422 | A | 2/1998 | Burr et al. |
| 5,726,488 | A | 3/1998 | Watanabe et al. |
| 5,726,562 | A | 3/1998 | Mizuno |
| 5,731,626 | A | 3/1998 | Eaglesham et al. |
| 5,736,419 | A | 4/1998 | Naem |
| 5,753,555 | A | 5/1998 | Hada |
| 5,754,826 | A | 5/1998 | Gamal et al. |
| 5,756,365 | A | 5/1998 | Kakumu |
| 5,763,921 | A | 6/1998 | Okumura et al. |
| 5,780,899 | A | 7/1998 | Hu et al. |
| 5,847,419 | A | 12/1998 | Imai et al. |
| 5,856,003 | A | 1/1999 | Chiu |
| 5,861,334 | A | 1/1999 | Rho |
| 5,877,049 | A | 3/1999 | Liu et al. |
| 5,885,876 | A | 3/1999 | Dennen |
| 5,889,315 | A | 3/1999 | Farrenkopf et al. |
| 5,895,954 | A | 4/1999 | Yasumura et al. |
| 5,899,714 | A | 5/1999 | Farrenkopf et al. |
| 5,905,402 | A | 5/1999 | Kim et al. |
| 5,918,129 | A | 6/1999 | Fulford, Jr. et al. |
| 5,923,067 | A | 7/1999 | Voldman |
| 5,923,987 | A | 7/1999 | Burr |
| 5,936,868 | A | 8/1999 | Hall |
| 5,946,214 | A | 8/1999 | Heavlin |
| 5,985,705 | A | 11/1999 | Seliskar |
| 5,989,963 | A | 11/1999 | Luning et al. |
| 6,001,695 | A | 12/1999 | Wu |
| 6,020,227 | A | 2/2000 | Bulucea |
| 6,043,139 | A | 3/2000 | Eaglesham et al. |
| 6,060,345 | A | 5/2000 | Hause et al. |
| 6,060,364 | A | 5/2000 | Maszara et al. |
| 6,066,533 | A | 5/2000 | Yu |
| 6,072,217 | A | 6/2000 | Burr |
| 6,087,210 | A | 7/2000 | Sohn |
| 6,087,691 | A | 7/2000 | Hamamoto |
| 6,088,518 | A | 7/2000 | Hsu |
| 6,091,286 | A | 7/2000 | Blauschild |
| 6,096,611 | A | 8/2000 | Wu |
| 6,103,562 | A | 8/2000 | Son et al. |
| 6,121,153 | A | 9/2000 | Kikkawa |
| 6,147,383 | A | 11/2000 | Kuroda |
| 6,153,920 | A | 11/2000 | Gossmann et al. |
| 6,157,073 | A | 12/2000 | Lehongres |
| 6,175,582 | B1 | 1/2001 | Naito et al. |
| 6,184,112 | B1 | 2/2001 | Maszara et al. |
| 6,190,979 | B1 | 2/2001 | Radens et al. |
| 6,194,259 | B1 | 2/2001 | Nayak et al. |
| 6,198,157 | B1 | 3/2001 | Ishida et al. |
| 6,201,761 | B1 | 3/2001 | Wollesen |
| 6,218,892 | B1 | 4/2001 | Soumyanath et al. |
| 6,218,895 | B1 | 4/2001 | De et al. |
| 6,221,724 | B1 | 4/2001 | Yu et al. |
| 6,229,188 | B1 | 5/2001 | Aoki et al. |
| 6,232,164 | B1 | 5/2001 | Tsai et al. |
| 6,232,793 | B1 | 5/2001 | Arimoto et al. |
| 6,235,597 | B1 | 5/2001 | Miles |
| 6,245,618 | B1 | 6/2001 | An et al. |
| 6,252,806 | B1 | 6/2001 | Ellis et al. |
| 6,268,640 | B1 | 7/2001 | Park et al. |
| 6,271,070 | B2 | 8/2001 | Kotani et al. |
| 6,271,551 | B1 | 8/2001 | Schmitz et al. |
| 6,272,666 | B1 | 8/2001 | Borkar et al. |
| 6,288,429 | B1 | 9/2001 | Iwata et al. |
| 6,297,132 | B1 | 10/2001 | Zhang et al. |
| 6,300,177 | B1 | 10/2001 | Sundaresan et al. |
| 6,313,489 | B1 | 11/2001 | Letavic et al. |
| 6,319,799 | B1 | 11/2001 | Ouyang et al. |
| 6,320,222 | B1 | 11/2001 | Forbes et al. |
| 6,323,525 | B1 | 11/2001 | Noguchi et al. |
| 6,326,666 | B1 | 12/2001 | Bernstein et al. |
| 6,335,233 | B1 | 1/2002 | Cho et al. |
| 6,341,087 | B1 | 1/2002 | Kunikiyo |
| 6,358,806 | B1 | 3/2002 | Puchner |
| 6,380,019 | B1 | 4/2002 | Yu et al. |
| 6,391,752 | B1 | 5/2002 | Colinge et al. |
| 6,426,260 | B1 | 7/2002 | Hshieh |
| 6,426,279 | B1 | 7/2002 | Huster et al. |
| 6,432,754 | B1 | 8/2002 | Assaderaghi et al. |
| 6,444,550 | B1 | 9/2002 | Hao et al. |
| 6,444,551 | B1 | 9/2002 | Ku et al. |
| 6,449,749 | B1 | 9/2002 | Stine |
| 6,461,920 | B1 | 10/2002 | Shirahata |
| 6,461,928 | B2 | 10/2002 | Rodder |
| 6,472,278 | B1 | 10/2002 | Marshall et al. |
| 6,482,714 | B1 | 11/2002 | Hieda et al. |
| 6,489,224 | B1 | 12/2002 | Burr |
| 6,492,232 | B1 | 12/2002 | Tang et al. |
| 6,500,739 | B1 | 12/2002 | Wang et al. |
| 6,503,801 | B1 | 1/2003 | Rouse et al. |
| 6,503,805 | B2 | 1/2003 | Wang et al. |
| 6,506,640 | B1 | 1/2003 | Ishida et al. |
| 6,518,623 | B1 | 2/2003 | Oda et al. |
| 6,521,470 | B1 | 2/2003 | Lin et al. |
| 6,534,373 | B1 | 3/2003 | Yu |
| 6,541,328 | B2 | 4/2003 | Whang et al. |
| 6,541,829 | B2 | 4/2003 | Nishinohara et al. |
| 6,548,842 | B1 | 4/2003 | Bulucea et al. |
| 6,551,885 | B1 | 4/2003 | Yu |
| 6,552,377 | B1 | 4/2003 | Yu |
| 6,573,129 | B2 | 6/2003 | Hoke et al. |
| 6,576,535 | B2 | 6/2003 | Drobny et al. |
| 6,600,200 | B1 | 7/2003 | Lustig et al. |
| 6,620,671 | B1 | 9/2003 | Wang et al. |
| 6,624,488 | B1 | 9/2003 | Kim |
| 6,627,473 | B1 | 9/2003 | Oikawa et al. |
| 6,630,710 | B1 | 10/2003 | Augusto |
| 6,660,605 | B1 | 12/2003 | Liu |
| 6,662,350 | B2 | 12/2003 | Fried et al. |
| 6,667,200 | B2 | 12/2003 | Sohn et al. |
| 6,670,260 | B1 | 12/2003 | Yu et al. |
| 6,693,333 | B1 | 2/2004 | Yu |
| 6,696,330 | B2 | 2/2004 | Forbes et al. |
| 6,730,568 | B2 | 5/2004 | Sohn |
| 6,737,724 | B2 | 5/2004 | Hieda et al. |
| 6,743,291 | B2 | 6/2004 | Ang et al. |
| 6,743,684 | B2 | 6/2004 | Liu |

(56) References Cited

U.S. PATENT DOCUMENTS

| | | |
|---|---|---|
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,342,291 B2 | 3/2008 | Vogelsang |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawae et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |

(56) References Cited

U.S. PATENT DOCUMENTS

| | | |
|---|---|---|
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,943,462 B1 | 5/2011 | Beyer et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,035,147 B2 | 10/2011 | Itoh et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 * | 9/2012 | Thompson et al. .......... 438/197 |
| 8,286,180 B2 | 10/2012 | Foo |
| 8,288,231 B1 | 10/2012 | Liao et al. |
| 8,288,798 B2 | 10/2012 | Passlack |
| 8,294,180 B2 | 10/2012 | Doyle et al. |
| 8,299,562 B2 | 10/2012 | Li et al. |
| 8,324,059 B2 | 12/2012 | Guo et al. |
| 8,372,721 B2 | 2/2013 | Chen et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0052219 A1 | 3/2005 | Butler et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0189082 A1 | 8/2006 | Vogelsang |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0210418 A1 | 9/2007 | Nakajima |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |

(56) References Cited

U.S. PATENT DOCUMENTS

| | | |
|---|---|---|
| 2009/0057728 A1 | 3/2009 | Boyle |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0074037 A1 | 3/2010 | Lin |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 * | 3/2011 | Thompson et al. .......... 327/543 |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0007194 A1 | 1/2012 | Sakakidani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0119804 A1 | 5/2012 | Ma |
| 2012/0132998 A1 | 5/2012 | Kwon et al. |
| 2012/0138953 A1 | 6/2012 | Cai et al. |
| 2012/0146148 A1 | 6/2012 | Iwamatsu |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |
| 2014/0092680 A1 | 4/2014 | Lee et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| EP | 2434493 A1 | 3/2012 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

(56) References Cited

OTHER PUBLICATIONS

Thompson, S et al., "MOS Scaling: Transistor Challenges for the 21st Century", 1998, Intel Technology Journal Q3' 1998, pp. 1-19.
Wann, C. et al., "Channel Profile Optimization and Device Design for Low-Power High-Performance Dynamic-Threshold MOSFET", 1996, IEDM 96, pp. 113-116.
PCT International Search Report for PCT/US2013/067832.
PCT Written Opinion of the International Search Authority for PCT/US2013/067832.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.
Wong, H et al., "Nanoscale CMOS", Proceedings of the IEEE, Vo. 87, No. 4, pp. 537-570.
Machine Translation of KR 10-0794094 Submitted herewith.
Werner, p. et al., "Carbon Diffusion in Silicon", Oct. 1998, Applied Physics Letters, vol. 73, No. 17, pp. 2465-2467.
Yan, Ran-Hong et al., "Scaling the Si MOSFET: From Bulk to SOI Bulk", Jul. 1992, IEEE Transactions on Electron Devices, vol. 39, No. 7.
English Translation of JP 8153873 Submitted herewith.

\* cited by examiner

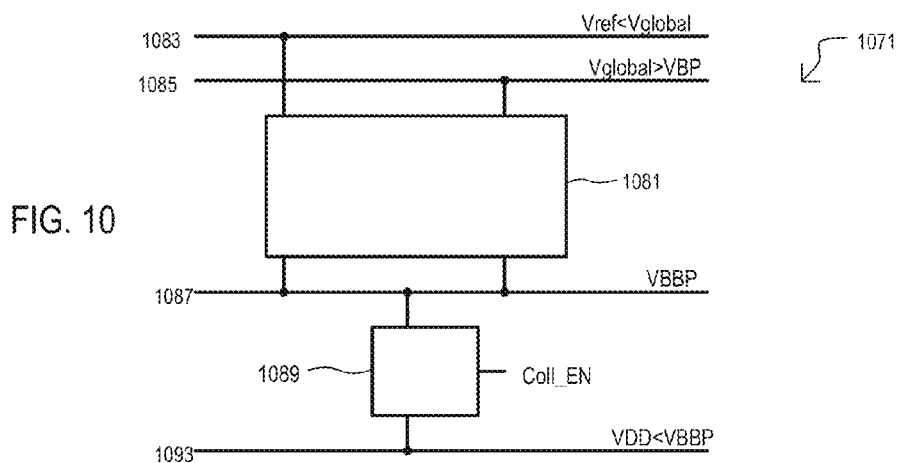
FIG. 10
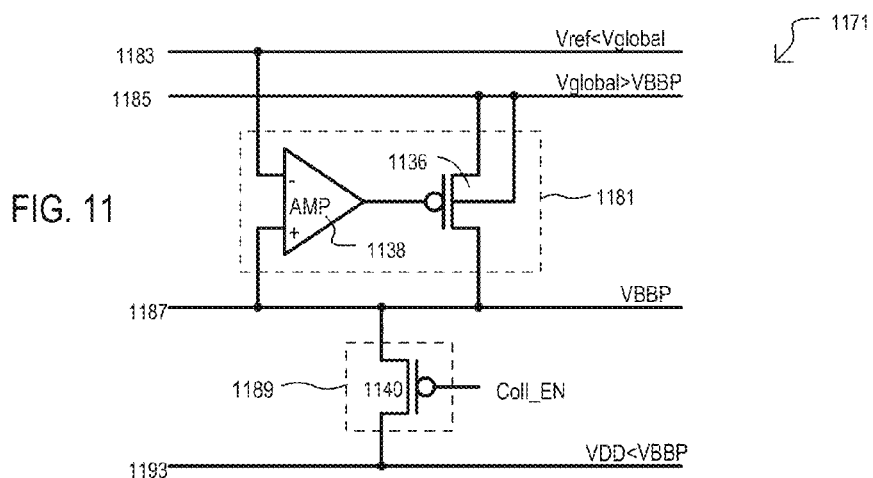
FIG. 11
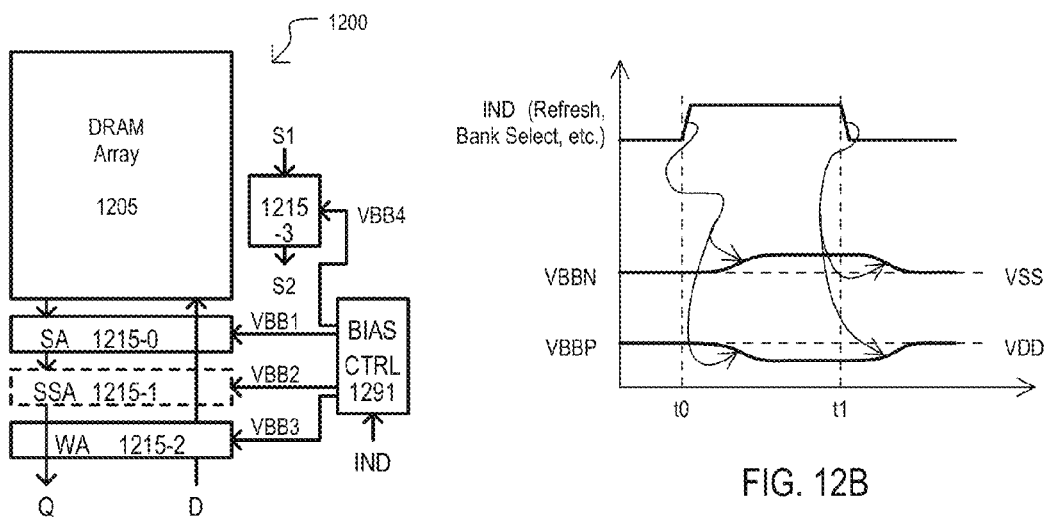
FIG. 12A
FIG. 12B

DYNAMIC RANDOM ACCESS MEMORY (DRAM) WITH LOW VARIATION TRANSISTOR PERIPHERAL CIRCUITS

CROSS-REFERENCE TO RELATED APPLICATIONS

This application claims the benefit of U.S. Provisional Application Ser. No. 61/720,932, filed on Oct. 31, 2012, the contents of which are incorporated by reference herein, in their entirety.

TECHNICAL FIELD

The present invention relates generally to memory circuits and methods, and more particularly to memory circuits that include dynamic random access memory (DRAM) type cells and methods of operating such memory circuits.

BACKGROUND

As integrated circuit (IC) process technology has scaled, it has become increasingly difficult to control the variation of transistor parameters. Because of such random variations, threshold voltage variations become a limiting factor in transistor design as process technology is scaled downward because voltage cannot be similarly scaled. In particular, threshold voltage variations between neighboring metal-oxide-semiconductor field effect transistors (MOSFETs) can have significant impact on the area and performance characteristics of dynamic random access memory (DRAM) devices. For example, threshold voltage variations between the cross-coupled p-channel MOS (PMOS) and/or n-channel MOS (NMOS) transistors in a typical DRAM sense amplifier can lead to increased data signal voltages on the bit lines to compensate for these variations. Other DRAM peripheral circuits can also be affected by the threshold voltage variations.

One way of reducing variation, improving performance, and decreasing overall power requirement relies on selective body bias control of transistors. However, there are many considerations to consider for best body bias operation in DRAM devices. Application of any particular body bias is typically inappropriate, since different circuits benefit from different biases, which may change with the mode of operation. For instance, some circuits benefit from higher performance, with leakage being of relatively less importance (e.g., sense amplifiers), while leakage is critical in others (e.g., data buffers). Additionally, some circuits may be excessively sensitive to noise produced on reverse-body biased transistors. For example, charge pump generated biases are known to negatively impact delay line performance, with the noise introducing a substantial jitter. This is due, in part, to the required reverse body bias (RBB) voltages typically being beyond the power supply levels (i.e., rails) of the device. Working around this limitation is difficult, since adding other power supplies can be prohibited by relevant industry standards, and in any case would substantially increase required circuit layout area and the bill of materials due to extra pins and power supplies. Moreover, since the charge pumps cannot supply RBB voltages immediately upon IC power-up (by definition they must pump sufficient charge into the required power rails first) devices using RBB may have excessive transistor leakage during power-up and power-on reset.

BRIEF DESCRIPTION OF THE DRAWINGS

FIG. 10 is a block diagram of a body bias control circuit that can be included in embodiments.

FIG. 11 is a block diagram of another body bias control circuit that can be included in embodiments.

FIG. 12A is a block diagram of a DRAM according to a further embodiment.

FIG. 12B is a timing diagram showing a dynamic body biasing operation for DDC transistors according to an embodiment.

DETAILED DESCRIPTION

Various embodiments will now be described below with reference to a number of drawings. These drawings depict various embodiments for the purposes of illustration only and are not intended to be limiting. One skilled in the art will readily recognize from the following description that various embodiments of the structures and methods illustrated herein may be employed without departing from the principles of the embodiments described herein.

In some embodiments, transistors can be employed that have a highly doped screening region formed below a channel, where a bias voltage can be applied to the screening region. Embodiments can also include circuits and methods related to an improved dynamic random access memory (DRAM), where one or more of the DRAM peripheral circuits use transistors having an enhanced body coefficient. Embodiments can also include circuits and methods related to an improved DRAM resulting from the use of transistors that have reduced variability of threshold voltage, and the ability to target a desired threshold voltage to obtain enhanced matching for matched transistor pairs used in DRAM peripheral circuits. Embodiment can further include DRAM timing circuits (e.g., delay lines, delay lock loops (DLLs), phase lock loops (PLLs)) that control timing according to biases to enhanced body coefficient transistors. Embodiment can also include DRAM well biasing circuits for low leakage power-up and reset operations.

Figure 1A:
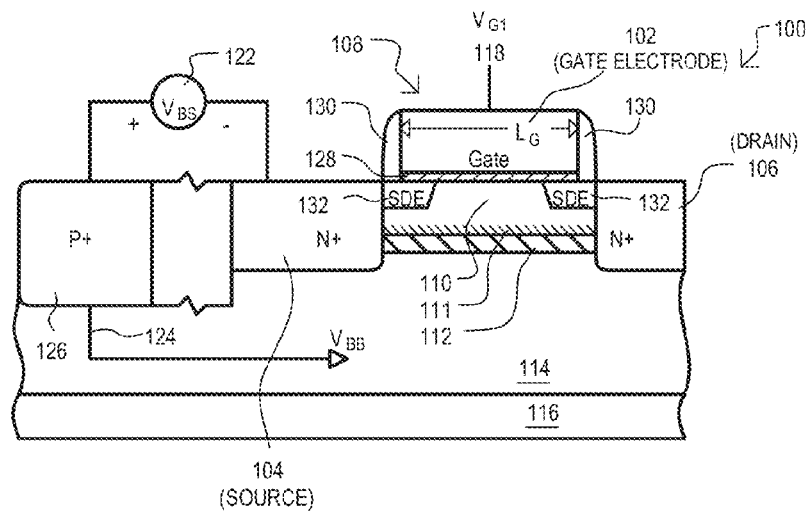
FIG. 1A is a side cross sectional view showing a deeply depleted channel (DDC) transistor that can be included in embodiments.

FIG. 1A shows an embodiment of a deeply depleted channel (DDC) transistor 100 having an enhanced body coefficient, along with the ability to set threshold voltage (Vt) with enhanced precision that can be included in embodiments. The DDC transistor 100 can include a gate electrode 102, source 104, drain 106, and a gate dielectric 128 positioned over a substantially undoped channel 110. Lightly doped source and drain extensions (SDE) 132, positioned respectively adjacent to source 104 and drain 106, extend toward each other, setting the transistor channel length.

In FIG. 1A, the DDC transistor 100 is shown as an N-channel transistor having a source 104 and drain 106 made of N-type dopant material, formed upon a substrate such as a P-type doped silicon substrate providing a P-well 114 formed on a substrate 116. In addition, the N-channel DDC transistor in FIG. 1A includes a highly doped screening region 112 made of P-type dopant material, and a threshold voltage set region 111 made of P-type dopant material. However, it will be understood that, with appropriate changes to dopant materials, a P-channel DDC transistor can be formed.

Referring still to FIG. 1A, a DDC transistor 100 can include a gate stack 108, which can include a gate insulator (also referred to as gate dielectric) 128 and gate electrode 102, where the gate electrode can be formed from one layer or multiple layers. Sidewalls 130 can be formed on the sides of gate stack 108. In particular embodiments, such sidewalls can serve as masks in the formation of the source and drain (104/106).

According to some embodiments, a DDC transistor 100 can have a body bias applied that can be different from that applied to the source 104. A body bias can be a reverse body bias (RBB) or a forward body bias (FBB). In the case of an N-channel DDC transistor a RBB can be more negative than the source voltage, while a FBB can be more positive than the source voltage. In the case of a P-channel DDC transistor a RBB can be greater than the source voltage, while a FBB can be less than the source voltage. In the particular embodiment shown, a body tap 126 can be included, formed of the same conductivity type as the well (P-type in the example shown) to enable the application of a body bias. In the very particular arrangement shown in FIG. 1A, body bias source 122 (VBs) applies a voltage that causes an FBB 124 to be applied via body tap 126. By operation of screening region 112, the effect of such a body bias can be enhanced with respect to a conventional transistor.

Figure 1B:
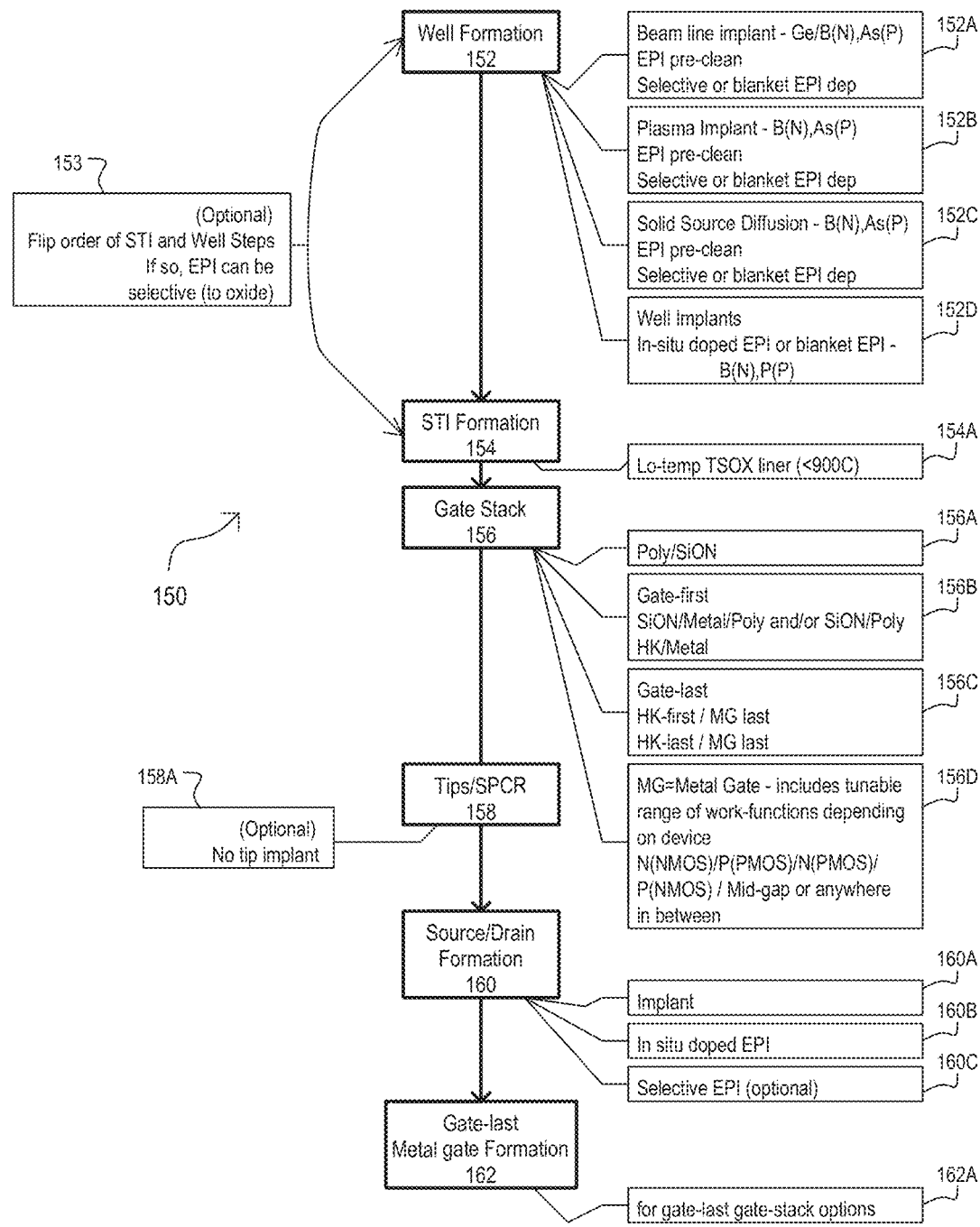
FIG. 1B is a flow diagram showing methods of fabricating DDC transistors that can be included in embodiments.

FIG. 1B is a flow diagram 150 illustrating a general method for forming a DDC transistor having an enhanced body coefficient and reduced σVt (threshold variation), in accordance with the various embodiments described herein. The process illustrated in FIG. 1B is intended to be general and broad in its description, and more detailed embodiments and examples are set forth below. Each block in the flow diagram is illustrated and described in further detail below, in conjunction with the various alternatives associated with each block illustrated in FIG. 1B.

Step 152 shows well formation, which can include one or more different process steps in accordance with different embodiments. The well formation step 152 can include the steps for forming the screening region 112, the threshold voltage set region 111 (if present), and the substantially undoped channel 110. As indicated in 153, the well formation 152 can be before or after STI (shallow trench isolation) formation 154. The well formation 152 can include forming the screening region 112 by implanting dopants into the P-well 114, followed by an epitaxial layer (EPI) pre-clean process that is followed by a blanket or selective EPI deposition. Various alternatives for performing these steps are illustrated in FIG. 1B. In accordance with one embodiment, well formation 152 can include a beam line implant of Ge/B (N), As (P), followed by an EPI pre-clean process, and followed by a non-selective blanket EPI deposition, as shown in 152A.

Alternatively, the well formation 152 can include using a plasma implant of B (N), As (P), followed by an EPI pre-clean, then a non-selective (blanket) EPI deposition, as shown in 152B. The well formation 152 can alternatively include a solid-source diffusion of B(N), As(P), followed by an EPI pre-clean, and followed by a non-selective (blanket) EPI deposition, as shown in 152C. As yet another alternative, well formation 152 can also include well implants, followed by in-situ doped selective EPI of B (N), P (P) as shown in 152D. As will be described further below, the well formation can be configured with different types of devices in mind, including DDC transistors, legacy transistors, high $V_T$ transistors, low $V_T$ transistors, improved $\sigma V_T$ transistors, and standard or legacy $\sigma V_T$ transistors. Embodiments described herein allow for any one of a number of devices configured on a common substrate with different well structures and according to different parameters.

In step 152, Boron (B), Indium (I), or other P-type materials can be used for P-type implants, and arsenic (As), antimony (Sb) or phosphorous (P) and other N-type materials can be used for N-type implants. In certain embodiments, the screening region 112 can have a dopant concentration between about $5 \times 10^{18}$ to $1 \times 10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, a threshold voltage set region 111 is positioned above the screening region 112. The threshold voltage set region 111 can be either adjacent to, incorporated within or vertically offset from the screening region. In certain embodiments, the threshold voltage set region 111 is formed by delta doping, controlled in-situ deposition, or atomic layer deposition. In alternative embodiments, the threshold voltage set region 111 can be formed by way of controlled outdiffusion of dopant material from the screening region 112 into an undoped epitaxial layer, or by way of a separate implantation into the substrate following formation of the screening region 112, before the undoped epitaxial layer is formed. Setting of the threshold voltage for the transistor is implemented by suitably selecting dopant concentration and thickness of the threshold voltage set region 111, as well as maintaining a separation of the threshold voltage set region 111 from the gate dielectric 128, leaving a substantially undoped channel layer directly adjacent to the gate dielectric 128. In certain embodiments, the threshold voltage set region 111 can have a dopant concentration between about $1 \times 10^{18}$ dopant atoms/cm$^3$ and about $1 \times 10^{19}$ dopant atoms per cm$^3$. In alternative embodiments, the threshold voltage set region 111 can have a dopant concentration that is approximately less than half of the concentration of dopants in the screening region 112.

In certain embodiments, the final layer of the channel is formed above the screening region 112 and threshold voltage set region 111 by way of a blanket or selective EPI deposition (as shown in the alternatives shown in 152A-D), to result in a substantially undoped channel region 110 of a thickness tailored to the technical specifications of the device. As a general matter, the thickness of the substantially undoped channel region 110 ranges from approximately 5-25 nm, with the selected thickness based upon the desired threshold voltage for the transistor. Preferably, a blanket EPI deposition step is performed after forming the screening region 112, and the threshold voltage set region 111 is formed by controlled outdiffusion of dopants from the screening region 112 into a portion of the blanket EPI layer, as described below. Dopant migration resistant layers of C, Ge, or the like can be utilized as needed to prevent dopant migration from the threshold voltage set region 111 into the substantially undoped channel region 110, or alternatively from the screening region 112 into the threshold voltage set region 111.

In addition to using dopant migration resistant layers, other techniques can be used to reduce upward migration of dopants from the screening region 112 and the threshold voltage set region 111, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 110 is positioned above the threshold voltage set region 111. Preferably, the substantially undoped channel region 110 has a dopant concentration less than $5 \times 10^{17}$ dopant atoms per cm$^3$ adjacent or near the gate dielectric 128. In some embodiments, the substantially undoped channel region 110 can have a dopant concentration that is specified to be approximately less than one tenth of the dopant concentration in the screening region 112. In still other embodiments, depending on the transistor characteristics desired, the substantially undoped channel region 110 may contain dopants so that the dopant concentration is elevated to above $5 \times 10^{17}$ dopant atoms per cm$^3$ adjacent or near the gate dielectric 128 or by using a very light dose of halo implants. Preferably, the substantially undoped channel region 110 remains substantially undoped by avoiding the use of heavy halo or other channel implants.

Referring to FIG. 1B, STI formation 154, which can occur before or after well formation 152, can include a low temperature trench sacrificial oxide (TSOX) liner, which is formed at a temperature lower than 900° C. as shown by 154A. Embodiments that form the STI structures after the blanket EPI deposition step, using a process that remains within a low thermal budget, can reduce dopant migration from the previously formed screening region 112 and threshold voltage set region 111.

As shown in step 156 (FIG. 1B), the gate stack 108 can be formed or otherwise constructed above the substantially undoped channel region 110 in a number of different ways, from different materials, and of different work functions. One option is a polysilicon/silicon oxynitride (poly/SiON) gate stack 156A. Another option is a gate-first process 156B that includes SiON/Metal/Poly and/or SiON/Poly, followed by high dielectric constant (High-K)/Metal Gate. Another option, a gate-last process 156C includes a high-K/metal gate stack wherein the gate stack can either be formed with "Hi-K first-Metal gate last" flow or and "Hi-K last-Metal gate last" flow. Yet another option, 156D is a metal gate that includes a tunable range of work functions depending on the device construction. Preferably, the metal gate materials for NMOS and/or PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 110 in a number of different ways, from different materials including polysilicon and metals to form what is known as "high-k metal gate". The metal gate process flow may be "gate $1^{st}$" or "gate last". Following formation of the gate stack, source/drain portions may be formed. Typically, the extension portions are implanted, followed by additional spacer formation and then implant or, alternatively, selective epitaxial deposition of deep source/drain regions.

In step 158, Source/Drain tips can be implanted. The dimensions of the tips can be varied as required, and will depend in part on whether gate spacers (SPCR) are used. In one embodiment, Source/Drain tips are not formed, and there may be no tip implant (as shown in step 158A).

In step 160, the source 104 and drain 106 can be formed preferably using conventional processes and materials such as ion implantation (160A) and in-situ doped epitaxial deposition (160B). Optionally, as shown in step 160C, PMOS or NMOS selective EPI layers can be formed in the source and drain regions as performance enhancers for strained channels. Source 104 and drain 106 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 112 and threshold voltage set region 111 substantially intact.

In step 162, a metal gate is formed in accordance with a gate last process (162A). Alternatively, a gate-first process can be used to form a metal gate.

Referring once again to FIG. 1A, the channel 110 contacts and extends between the source 104 and the drain 106, and supports movement of mobile charge carriers between the source and the drain. In operation, when gate electrode voltage ($V_{G1}$) 118 is applied to the DDC transistor 100 at a predetermined level, a depletion region formed in the substantially undoped channel 110 can extend to the screening region 112, since channel depletion depth is a function of the integrated charge from dopants in the doped channel lattice, and the substantially undoped channel 110 has very few dopants. The screening region 112, if fabricated according to specification, effectively pins the depletion region to define the depletion zone width.

As will also be appreciated, position, concentration, and thickness of the screening region 112 are important factors in the design of the DDC transistor. In certain embodiments, the screening region is located above the bottom of the source and drain junctions. To dope the screening region so as to cause its peak dopant concentration to define the edge of the depletion width when the transistor is turned on, methods such as delta doping, broad dopant implants, or in-situ doping are preferred, since the screening region 112 should have a finite thickness to enable the screening region 112 to adequately screen the well therebelow while avoiding creating a path for excessive junction leakage. When transistors are configured to have such screening regions, the transistor can simultaneously have good threshold voltage matching, high output resistance, low junction leakage, good short channel effects, and still have an independently controllable body due to a strong body effect. In addition, multiple DDC transistors having different threshold voltages can be easily implemented by customizing the position, thickness, and dopant concentration of the threshold voltage set region 111 and/or the screening region 112 while at the same time achieving a reduction in the threshold voltage variation. In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately 1/10 of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 111 positioned above the screening region 112 and below the substantially undoped channel 110 is an alternative technique to conventional threshold voltage implants for adjusting threshold voltage. Care must be taken to prevent dopant migration into the substantially undoped channel 110, and use of low temperature anneals and anti-migration materials such as carbon or germanium is recommended for many applications. More information about the formation of the threshold voltage set region 111 and the DDC transistor is found in US Patent Publication No. 2011/0079861 A1, published on Apr. 7, 2011 corresponding to application Ser. No. 12/895,785 filed Sep. 30, 2010, the entirety of which disclosure is herein incorporated by reference.

Yet another technique for modifying threshold voltage relies on selection of a gate material having a suitable work function. The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers. In certain embodiments, metals having a work function intermediate between band edge and mid-gap can be selected. As discussed in U.S. Pat. No. 8,569,128, issued on Oct. 29, 2013 corresponding to U.S. patent application Ser. No. 12/960,266 filed Dec. 3, 2010, the entirety of which disclosure is herein incorporated by reference, such metal gates simplify swapping of PMOS and NMOS gate metals to allow a reduction in mask steps and different required metal types for systems on a chip or other die supporting multiple transistor types.

Applied bias to the screening region 112 is yet another technique for modifying threshold voltage of the DDC 100. The screening region 112 sets the body effect for the transistor and allows for a higher body effect than is found in conventional FET technologies. For example, a body tap 126 to the screening region 112 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in U.S. Pat. No. 8,273,617 issued Sep. 25, 2012, the entirety of which disclosure is herein incorporated by reference.

Advantageously, DDC transistors created in accordance with the foregoing embodiments, structures, and processes, can have a reduced mismatch arising from scattered or random dopant variations as compared to conventional MOS transistors. In certain embodiments, the reduced variation results from the adoption of structures such as the screening region, the optional threshold voltage set region, and the epitaxially grown channel region. In certain alternative embodiments, mismatch between DDC transistors can be reduced by implanting the screening layer across multiple DDC transistors before the creation of transistor isolation structures, and forming the channel layer as a blanket epitaxial layer that is grown before the creation of transistor epitaxial structures. In certain embodiments, the screening region has a substantially uniform concentration of dopants in a lateral plane. The DDC transistor can be formed using a semiconductor process having a thermal budget that allows for a reasonable throughput while managing the diffusivities of the dopants in the channel. Further examples of transistor structure and manufacture suitable for use in DDC transistors are disclosed in U.S. Pat. No. 8,273,617 issued Sep. 25, 2012, titled ELECTRONIC DEVICES AND SYSTEMS, AND METHODS FOR MAKING AND USING THE SAME, by Scott E. Thompson et al., as well as U.S. Pat. No. 8,530,286 issued Sep. 10, 2013 corresponding to U.S. patent application Ser. No. 12/971,884, filed on Dec. 17, 2010 titled Low Power Semiconductor Transistor Structure and Method of Fabrication Thereof and US Patent Publication No. 2011/0309447 A1, published on Dec. 22, 2011 corresponding to U.S. patent application Ser. No. 12/971,955 filed on Dec. 17, 2010 titled Transistor with Threshold Voltage Set Notch and Method of Fabrication Thereof, the respective contents of which are incorporated by reference herein.

Embodiments of DRAM using DDC transistors to implement one or more of the DRAM peripheral circuits can have enhanced performance characteristics as compared to DRAM using conventional MOSFETs to implement these peripheral circuits. Some of the reasons for the enhanced performance characteristics are (1) DDC transistors can have lower threshold voltage variation, i.e., lower $\sigma V_T$, and/or (2) DDC transistors have higher $I_{eff}$ and higher body coefficient. As a result, DRAM sense amplifiers using DDC transistors can provide (1) reduced power supply voltage VINT for the DRAM sense amplifiers resulting from a reduction of design margin due to the lower $\sigma V_T$ of DDC transistors; and/or (2) reduced power consumption for the DRAM sense amplifiers and other peripheral circuits resulting from the reduced power supply voltage.

Figure 2A:
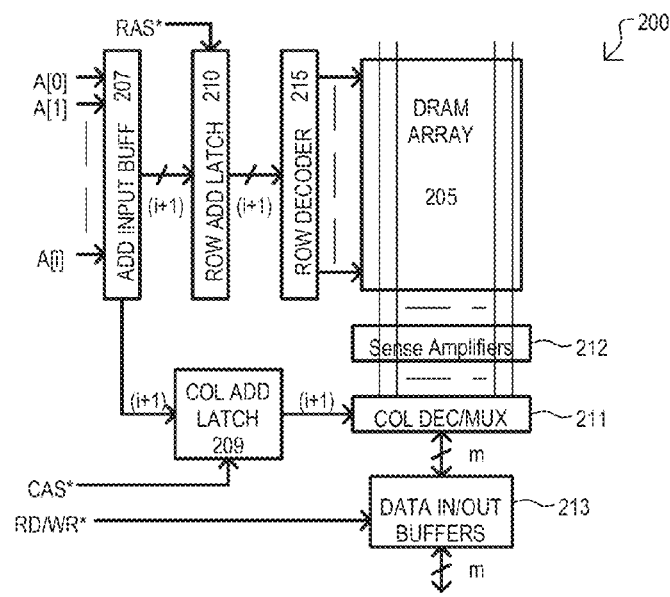
FIG. 2A is a block diagram of a dynamic random access memory (DRAM) according to an embodiment.

FIG. 2A is a block diagram of a DRAM 200, according to embodiments, where the DRAM includes one or more peripheral circuits implemented using DDC transistors. The DRAM 200 includes a DRAM array 205 that has the DRAM cells for storing data. The DRAM 200 also includes DRAM peripheral circuits that are used to access data stored in the DRAM array 205. In the particular embodiment shown, such DRAM peripheral circuits can include, address input buffers 207 row and column address latches (210/209), row and column multiplexer/decoders (215/211), sense amplifiers 212, and data input/out buffers 213.

Typically, a DRAM can use multiplexed addressing in which row and column address components are received on the same address pins A[0] . . . A[i] at different times. In a particular embodiment, in response to a falling edge of a row address strobe (RAS*), address values present on the DRAM address pins A[0] to A[i] can be provided to row address latches. In response to a falling edge of a column address strobe (CAS*), address values present on the DRAM address pins A[0] to A[i] can be provided to column address latches. Typically the RAS* signal is asserted first, to latch the row address component in the row address latch 210. After the row address component has been latched, the CAS* signal is asserted to latch the column address component in the column address latch 209.

Referring to FIG. 2A, application of the row address component can cause the retrieval of a complete row from the DRAM array 205. Typically, it takes a predetermined duration of time for the data values stored in the row accessed by the row address to propagate down the bit lines to the sense amplifiers 212, and for the sense amplifier 212 outputs to stabilize. The column address component can configure the column decoder/multiplexor 211 to select the data corresponding to the DRAM address (i.e., the combination of the row and column address component) from the row data values sensed by the sense amplifier, and the selected data can be driven on the output pins through the DRAM in/out buffers 213. Typically, the column address multiplexor selects the data to be driven on the output pins after the sense amplifier outputs have stabilized.

It is understood that any of the peripheral circuits (i.e., those outside of the DRAM array 205) can include DDC transistors.

While FIG. 2A shows a DRAM with a multiplexed address configuration, alternate embodiments can include other interfaces, including "pseudo-SRAM" interfaces having non-multiplexed address inputs. Further, DRAMs according to embodiments can include background refresh operations as well as refresh operations initiated by input signals.

Figure 2B:
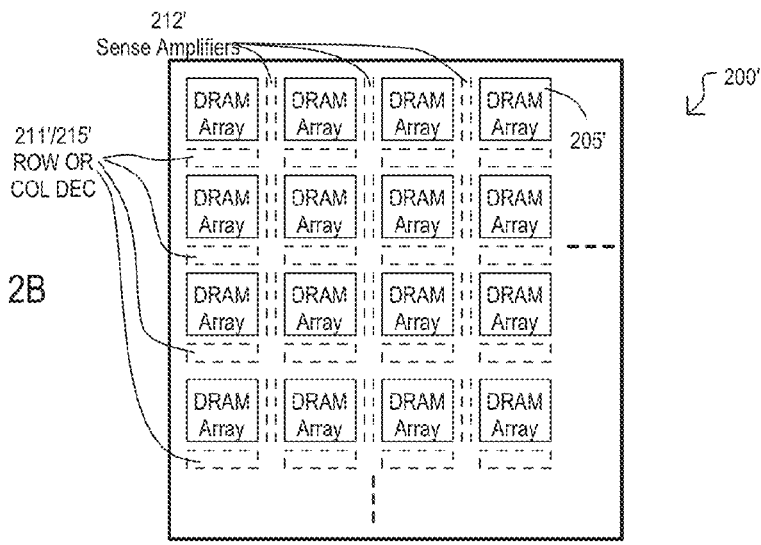
FIG. 2B is a layout of a DRAM according to an embodiment.

FIG. 2B is a layout of a DRAM 200', in accordance with one embodiment. The DRAM can include multiple arrays of DRAM cells (one shown as 205') extending in both horizontal and vertical directions. Typically, the DRAM arrays 205' can be separated by strips of sense amplifiers and column muxes (212' and 211') in a first direction, (e.g., the sense amplifiers and column muxes are along the vertical strips shown in FIG. 2B). The DRAM arrays 205' can be separated by strips in a second direction, which can include row decoders (215') (e.g., the row decoders are formed along the horizontal strips shown in FIG. 2B).

Figure 3A:
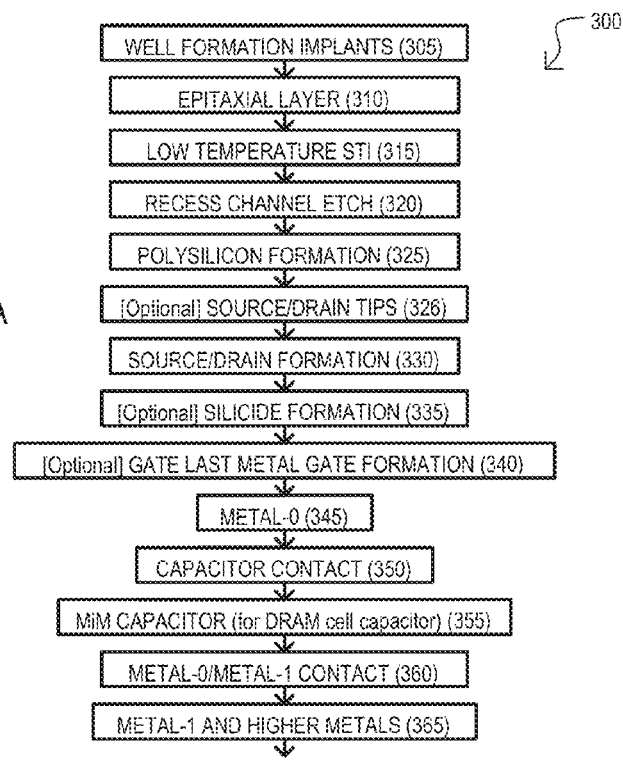
FIG. 3A is a flow diagram of a method of making a DRAM according to an embodiment.

FIG. 3A is a flow diagram 300 illustrating a general method for forming a DRAM according to an embodiment. Flow diagram 300 shows an arrangement in which peripheral circuits of the DRAM can use DDC transistors having an enhanced body coefficient and reduced σVt, in accordance with the various embodiments described herein. The flow diagram 300 provides a method for forming DDC transistors, recessed channel array transistors (RCAT) that are used as the DRAM cell access transistors, and DRAM cell capacitors on the same silicon substrate.

In step 305, wells can be formed with implants, which can include one or more different process steps in accordance with different embodiments. The well formation step 305 can include the steps for forming a screening region 112 and optional threshold voltage set region 111. In step 310, a blanket or selective epitaxial deposition is performed to result in a substantially undoped channel region 110. The steps for forming the screening region 112, the threshold voltage set region 111, and the undoped channel region 110 can be performed in accordance with the description of the corresponding steps provided with reference to FIGS. 1A and 1B.

In step 315, shallow trench isolation (STI) regions are formed using a low temperature STI process. This low temperature STI step can be similar to the STI formation step 154 (FIG. 1B). The STI regions electrically isolate the active regions of the partially formed DDC transistors as well as the RCAT devices that are yet to be formed. In step 320, a recess channel etch is performed to selectively form the recessed channel in areas of the substrate where the RCAT devices are to be formed.

In step 325, a polysilicon layer is formed over selective areas of the substrate as part of forming gate stacks for both the DDC transistors and the RCAT devices. The DDC transistor gate stack can be formed in a number of different ways, from different materials, and of different work functions, as discussed with reference to step 156 (FIG. 1B). Such alternatives can include, a poly/SiON gate stack (as shown in step 156A of FIG. 1B); a gate-first process that includes SiON/Metal/Poly and/or SiON/Poly, followed by High-K/Metal Gate (as shown in step 156B of FIG. 1B); a gate-last process that includes a high-K/metal gate stack wherein the gate stack can either be formed with "Hi-K first-Metal gate last" flow or and "Hi-K last-Metal gate last" flow (as shown in step 156C of FIG. 1B); or a metal gate that includes a tunable range of work functions depending on the device construction (as shown in step 156D of FIG. 1B).

In step 330, the source and drain regions for the DDC transistors and the RCAT devices are formed. The source drain formation of the DDC transistors can be performed in accordance with the description for step 160 (FIG. 1B). Optionally, source/drain tip implants can be performed prior to forming the source and drain regions, as shown in step 326.

In step 335, silicide regions can be formed over the polysilicon gate layers formed in step 325. In step 340, a metal gate can be formed in accordance with a gate last process. Steps 335 and 340 are optional, and either one or both may be performed for silicide or gate-last processes, respectively.

In step 345, a Metal-0 layer is formed. In step 350, capacitor contacts are formed to contact one of the plates of the metal insulator metal (MiM) capacitors to be formed. In step 355, the MiM capacitors are formed. This is followed by forming the Metal-0/Metal-1 contact in step 360, and forming Metal-1 layer in step 365. Optionally, additional contacts and metal layers can also be formed if additional metal layers are to be formed above the Metal-1 layer.

Figure 3B:
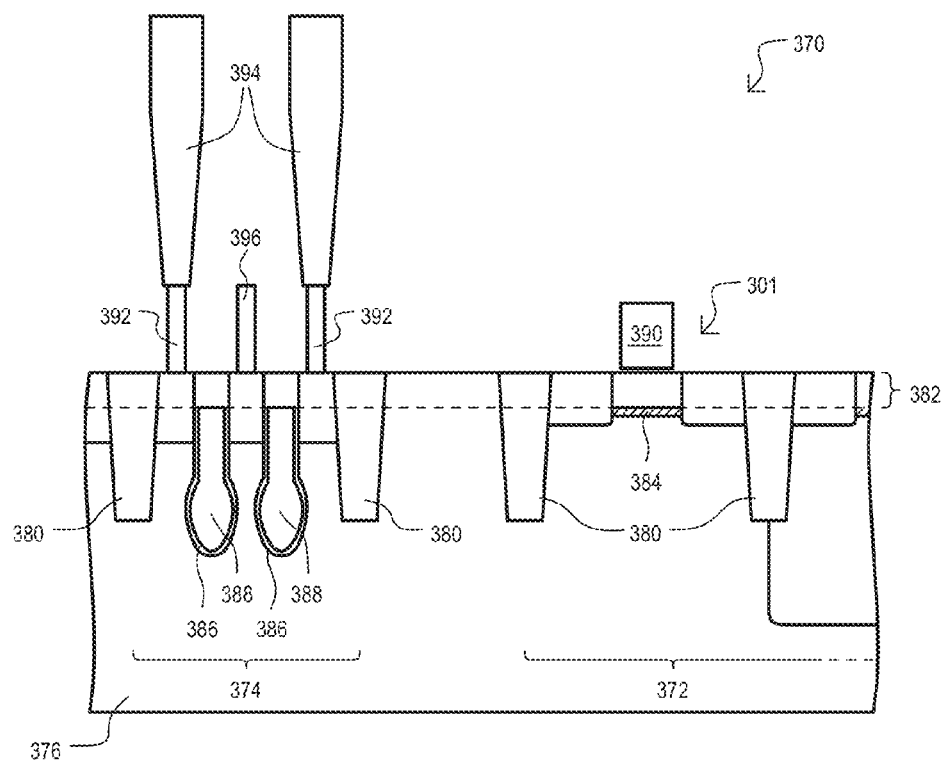
FIG. 3B is a side cross sectional view of a DRAM according to an embodiment.

FIG. 3B is a cross-sectional view of an integrated circuit 370 having a DDC transistor region 372 and a DRAM core region 374 on a common semiconductor substrate, in accordance with one embodiment. Even though the integrated circuit 370 shows a DRAM core having an RCAT device, other device types can be used in alternative embodiments of the DRAM core. The integrated circuit 370 can be fabricated using the process discussed above with reference to FIG. 3A. The DRAM core region 374 and the DDC transistor region 372 are formed on the same semiconductor substrate 376, and are electrically separated from each other by the STI regions 380. A substantially undoped epitaxial layer 382 extends across both the RCAT device region 374 and the DDC transistor region 372. Typically, as discussed above, the epitaxial layer 382 is formed as a blanket epitaxial layer, after the screening region 384 has been formed for the DDC transistor 301. In addition, as discussed above, an optional threshold voltage set region (not shown) can also be formed above the screening region 384. The RCAT devices include a dielectric layer 386 that is deposited in the recessed channel, and a gate fill material 388. The gate fill material can be any suitable material, including metal or polysilicon. In one embodiment, the RCAT devices are formed by depositing a conformal high-k dielectric layer on the sidewalls of the recessed channel, and subsequently filling the recessed channel with a gate metal having a predetermined work function. The gate stack 390 of the DDC transistor can be any suitable material, including polysilicon or metal. The two RCAT devices shown are connected to the DRAM capacitors 394 of the respective DRAM cells by forming contacts 392. The two RCAT devices are also connected to a contact/bit line by forming contact 396. The DRAM core device gate may also be recessed, as is common, to limit coupling capacitances.

In some embodiments, a same body bias can be applied to common NMOS bulk region 376 as required by the DRAM devices to meet the retention time specifications, and to raise the DDC device threshold voltage from a base value. In addition or alternatively, such a body bias voltage can modulate a DDC transistor to operate at a different target Vt. A DDC device threshold voltage can be adjusted to a target Vt using the techniques discussed above including any of: the position and doping concentration of the screening region and/or the threshold voltage set region, and the thickness of the substantially undoped channel region, targeting the work function of the device, and applying back body bias to the transistor.

In this way, one or more peripheral circuits of a DRAM integrated circuit can include DDC transistors.

Having described a DRAM integrated circuit with peripheral circuits having DDC transistors, particular peripheral circuit configurations will now be described.

Figure 4:
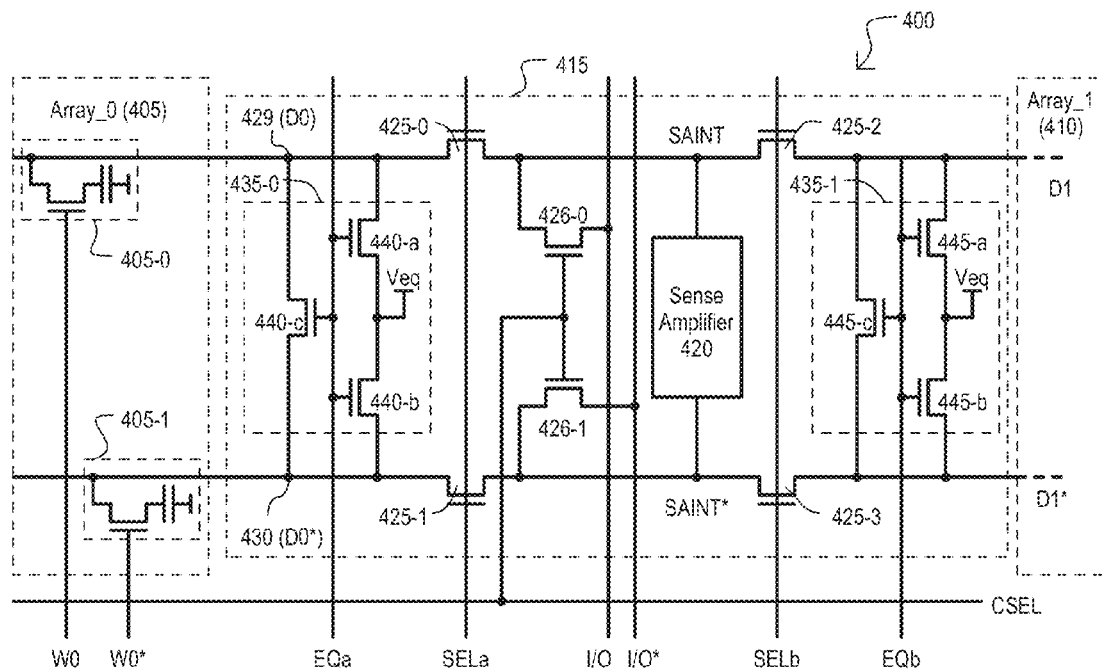
FIG. 4 is a block schematic diagram of a portion of DRAM integrated circuit according to an embodiment.

Referring initially to FIG. 4, an integrated circuit according to an embodiment is shown in a block diagram and designated by the general reference character 400. Integrated circuit 400 is a DRAM that may include a number of arrays of DRAM cells, including DRAM cells arranged in multiple rows and columns. For ease of discussion, however, only two DRAM arrays 405 and 410 are illustrated and discussed along with the associated peripheral circuitry 415 used to perform read and write operations. A write operation stores data in a selected DRAM cell, and a read operation accesses data stored in a selected DRAM cell.

Each DRAM array (e.g., 405 and 410) includes a number of DRAM cells arranged into rows and columns. Typically each memory cell can include one access transistor and one capacitor. One terminal of the access transistor is connected to a bit line of the DRAM array, and the other terminal of the access transistor is connected to a terminal of its capacitor. The gate terminal of the access transistor is connected to a word line of the DRAM array. The access transistor thus acts as a switch that can connect the capacitor of its cell to a bit line of the DRAM array, where the switch is turned on when the cell's word line is activated and turned off when the cell's word line is deactivated.

The second terminal of the capacitor can be connected to a voltage source that typically supplies a voltage of magnitude Vdd/2. The charge stored in the capacitor represents the data stored in the DRAM cell, i.e., either a logic high or a logic low. Storing a logic "1" can correspond to a voltage of (or about) Vdd/2 across the capacitor, and storing a logic "0" can correspond to a voltage of (or about) −Vdd/2 across the capacitor. In alternative embodiments, the capacitor can be connected to a voltage source of magnitude Vss or ground, and storing a logic "1" or "0" can correspond to storing a voltage of (or about) Vdd or of (or about) Vss across the capacitor, respectively.

When the word line connected to a particular DRAM cell of the DRAM array is activated to select the DRAM cell, the access transistor in the selected DRAM cell connects the capacitor in that cell to the bit line. The selected DRAM cell can be accessed to read data stored in the cell or to write data to the cell. Reading data from the selected DRAM cell involves the use of a sense amplifier to detect whether the voltage level stored in the selected DRAM cell (i.e., the charge stored in the capacitor of the DRAM cell) corresponds to a logic "1" or a logic "0".

A DRAM can be designed to have a pair of complementary bit lines corresponding to each DRAM cell. Referring to FIG. 4, a sense amplifier 420 can be connected between a pair of complementary bit lines 429 (D0) and 430 (D0*) that are the true and complementary bit lines, respectively, corresponding to the DRAM cell 405-0 (in array 405) and vice versa for the DRAM cell 405-1 (in array 405). One of the two DRAM arrays 405, 410 is selectively connected to the sense amplifier 420 by signals to SELa and SELb, which are connected to transistors 425-0/1 and 425-2/3, respectively. For example, when SELa is driven high and SELb is low, transistors 425-0/1 operate in the conductive state to connect DRAM cells in array 405 to the sense amplifier 420, and transistors 425-2/3 operate in the non-conductive state to isolate DRAM cells in array 410 from the sense amplifier 420. Conversely, when SELb is driven to a high level and SELa is driven to a low level, transistors 425-2/3 operate in the conductive state to connect DRAM cells in array 410 to sense amplifier 420, and transistors 425-0/1 operate in the non-conductive state to isolate DRAM cells in array 405 from sense amplifier 420.

When the DRAM cell 405-0 is selected for a read operation, the sense amplifier 420 determines the data value stored in the cell by charge sharing between the cell storage capacitor and the capacitance of the bit line as the word line is selected, then sensing the differential voltage between the complementary bit lines 429 (D0) and 430 (D0*). Typically, equilibration circuits such as 435-0/1 are connected between the complementary bit lines to equilibrate the charge on the complementary bit lines at a voltage typically at or near Vdd/2 (designated as Veq in this case) prior to the charge sharing operation. Equilibration circuit 435-0 includes first and second transistors 440-a and 440-b. In response to control signal EQa, transistors 440-a/b can be placed into a conductive state to apply an equilibration voltage Veq to bit lines D0/D0*. In the embodiment shown, equilibration circuit 435-0 can also include a third transistor 440-c that is configured to short the two complementary bit lines under the control of the equilibration control signal EQa. Therefore, when the control signal EQa is driven high, equilibration circuit 435-0 connects the bit line 429 (D0) to the bit line 430 (D0*), effectively shorting the two complementary bit lines, and connects the complementary bit lines to the equilibration voltage Veq. Equilibration circuit 435-1 has corresponding transistors 445-a, 445-b, and 445-c that are connected to equilibration control signal EQb. When the control signal EQb is driven to a logic high voltage level, equilibration circuit 440-0 connects the bit line D1 to the bit line D1*, effectively shorting the two complementary bit lines, and also connects these complementary bit lines to the equilibration voltage Veq. Typically the equilibration voltage Veq is set at or near Vdd/2. Equilibration circuits 435-0 and 435-1 are respectively used to equilibrate the complementary bit lines when the DRAM array 405 and 410 are accessed.

The equilibration signals of the DRAM (e.g., EQa, EQb) are typically held in the "on" state when the bit line is not being accessed, then driven to a low voltage level at the beginning of the access operation to that bit line. After this equilibration operation, the word lines corresponding to the selected DRAM cells that are to be accessed are activated. Once sufficient time has been allowed to fully charge share between the bit cell storage capacitor and the bit line, the sense amplifier is enabled to drive the bit lines from the small differential state caused by the charge sharing to full rail (Vdd and Vss) levels in the same direction. For example, referring to FIG. 4, after activation of the word line W0, when the sense amplifier 420 has sensed the differential voltage between the complementary bit lines 429 (D0) and 430 (D0*), a signal representing the charge stored in the selected DRAM cell capacitor is output on the pair of complementary input/output lines I/O and I/O*. In particular, a column select signal CSEL is applied to transistors 426-0 and 426-1 to connect the complementary bit lines 429 (D0) and 430 (D0*) to the respective complementary input/output lines (via column select transistors 425-0/1) after the sense amplifier has completed sensing the differential voltage.

Figure 5:
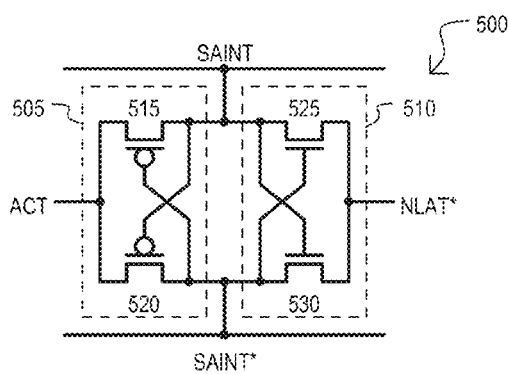
FIG. 5 is a schematic diagram of a sense amplifier according to an embodiment.

FIG. 5 illustrates an embodiment of a sense amplifier 500 like that shown as 420 in FIG. 4. The sense amplifier 500 includes a P-type section 505 and an N-type section 510, which work together to sense the differential voltage between the complementary nodes SAINT and SAINT* (which can be connected to complementary bit lines) and drive nodes to (or toward) Vdd and Vss in accordance with the charge stored in the capacitor of the selected DRAM cell connected to one of the bit lines. The N-type section 510 can include cross-coupled NMOS transistors 525 and 530 that drive the node (SAINT or SAINT*) having a lower voltage (of the two complementary bit lines D0 and D0*) to (or toward) Vss. The P-type section 505 can include cross-coupled PMOS transistors 515 and 520 that drive the bit line having a higher voltage to (or toward) Vdd. An N-type section common node NLAT* is connected to the sources of the two cross-coupled NMOS transistors 525, 530. The P-type section common node ACT is connected to the sources of the two cross-coupled PMOS transistors 515, 520.

In operation, initially, after the equilibration signal has been deasserted and before the word line has been activated, the sense amplifier internal nodes SAINT and SAINT* can be initially at (or about) Vdd/2 (as a result of the equilibration), NLAT* and ACT are also equilibrated to Vdd/2. Therefore, the n-channel transistors within N-type section 510 can be in a non-conductive state because their gate-to-source potential (Vgs) is zero, and the p-channel transistors within P-type section 505 can be in a non-conductive state, because their Vgs is also zero. After the word line is activated, a signal voltage develops between SAINT and SAINT*, where the voltage on one of these nodes is driven to a level that is either higher or lower than Vdd/2 in accordance with the charge stored in the accessed DRAM cell. For example, if a logic "1" is stored in the selected DRAM cell, SAINT can rise to a voltage higher than Vdd/2, and if a logic "0" is stored in the selected DRAM cell, SAINT can fall to a voltage lower than Vdd/2.

The N-type section 510 and the P-type section 505 can be activated (i.e., fired) and the sensing operation can be started by driving the voltage at NLAT* toward Vss, and the voltage at ACT toward Vdd. As the voltage between NLAT* and the complementary nodes SAINT, SAINT* approaches the threshold voltage of the NMOS transistors 525, 530, the NMOS transistor having a gate connected to the bit line having the higher voltage can begin to conduct, and therefore, start discharging its corresponding node (SAINT or SAINT*) and bit line towards the voltage at NLAT*. As the NLAT* node voltage reaches Vss, the bit line having the lower voltage is also discharged to Vss. The other NMOS transistor does not conduct during this time interval because its gate terminal is connected to the node (SAINT* or SAINT) having the lower voltage, which is discharging towards Vss.

The P-type section 505 can be fired by driving the voltage at node ACT towards Vdd. In some embodiments, at this time one node (SAINT or SAINT*) is being driven towards Vss by the N-type section 510. The PMOS transistor (515 or 520) having its gate connected to the node having the lower voltage is driven into the conductive state. As a result, the bit line having the higher voltage can charge towards the voltage on node ACT, and ultimately can reach Vdd as the voltage on the ACT node reaches Vdd.

During a sense operation, nodes SAINT and SAINT* can remain connected to their respective bit lines. Further, the access transistor of the selected DRAM cell can remain in a conductive state. Thus, the capacitor of the DRAM cell can be charged toward Vdd or discharged toward Vss according to its previously stored data. That is, the data value of the DRAM cell is refreshed.

In some embodiments, the N-type section 510 and P-type section 505 can be fired simultaneously. However, in an alternative embodiment, the N-type section and P-type section can be fired sequentially, where the N-type section 510 is fired first by driving the NLAT* node towards Vss. The P-type section 505 can then be fired shortly after by driving the ACT node towards Vdd.

According to embodiments, DRAM sense amplifiers, including any of those shown in FIG. 4 or 5, can use DDC transistors having enhanced performance characteristics as compared to those using conventional MOSFETs. Typically, one DRAM sense amplifier can be connected to multiple DRAM cells.

This can result in low voltage level swings on a bit line during the sensing operation because the significant capacitive loading of the bit line reduces the magnitude of the voltage level swing on the bit line when a selected DRAM cell is connected to the bit line. Therefore, a DRAM sense amplifier is designed to accurately sense this reduced voltage differential across its connected bit lines.

Conventionally, due to the presence of threshold voltage variations of transistors within the sense amplifier, a bit line high voltage level (VBLH), the level at which a high logic value is sensed, is typically set with some margin to account for possible errors introduced by threshold mismatch. Note that the mismatch can be modeled as an error voltage superimposed between SAINT and SAINT*.

On the other hand, according to embodiments, a DRAM sense amplifier can use comparably sized DDC transistors to sense selected DRAM cells. In such embodiments, due to lower threshold voltage variation, there can be reduced error voltage on a bit line. Consequently, sense amplifiers according to embodiments can operate at lower VBLH levels than conventional sense amplifiers. Lower VBLH levels can result in lower sensing times and thus reductions in power consumption and/or faster access speeds.

As was noted previously, a DRAM cell read operation can refresh the data present in the cell. Due to charge leakage from DRAM cell capacitors, data stored in the DRAM cell must be refreshed periodically to restore the storage level of the DRAM cell. The time elapsed from the time that data is stored in a DRAM cell to the time that the data is on the threshold of being corrupted due to charge leakage is referred to as the data retention time of the DRAM. The longer the data retention time, the less frequently the DRAM cell needs to be refreshed. Each refresh operation for the DRAM consumes power. Therefore, the longer the data retention time, the lower the refresh power consumption of the DRAM. Reduced refresh power is particularly advantageous during a standby mode of the DRAM, when the data stored in the DRAM is not being accessed, because refresh power consumption is a substantial portion of DRAM power consumption in standby mode. Thus, reduced refresh power consumption can be advantageously used in low power applications, such as cell phones or mobile products, where a substantial portion of the DRAM power consumption is the refresh power consumption.

According to embodiments, DRAM sense amplifiers implementing DDC transistors can extend the DRAM refresh interval, because the reduced threshold voltage variation of tDDC transistors can provide sense amplifiers having an enhanced sensitivity, i.e., sense amplifiers that can accurately sense the bit line voltage at a VBLH that is lower than a conventional sense amplifier. A reduction in threshold variation for DDC transistors used in the sense amplifier can provide a corresponding increase in the DRAM refresh timing interval. This reduces the power requirement for the integrated circuit or increases the performance for a given power, since refresh operations are a significant power factor in DRAM and enhances performance and there is more time for read/write operations instead of refresh. Sense amplifiers with reduced VBLH, according to embodiments, can be advantageously used to reduce area in a DRAM over a conventional DRAM architecture. According to an embodiment, DRAM sense amplifiers using DDC transistors can be connected to a larger number of DRAM cells (as compared to a sense amplifier with conventional transistors) by a wiring (i.e., bit line) since these sense amplifiers can operate with a lower VBLH. Therefore, the DRAM can be implemented using a reduced number of sense amplifiers resulting in reduced area. In addition or alternatively, the size of the matching transistors in the sense amplifiers can also be reduced as a result of the reduced threshold voltage variation of DDC transistors. This can provide additional area reduction for a DRAM that uses sense amplifier implemented using DDC transistors as compared with a DRAM fabricated with conventional transistors of comparable size for the same process node.

Figure 6A:
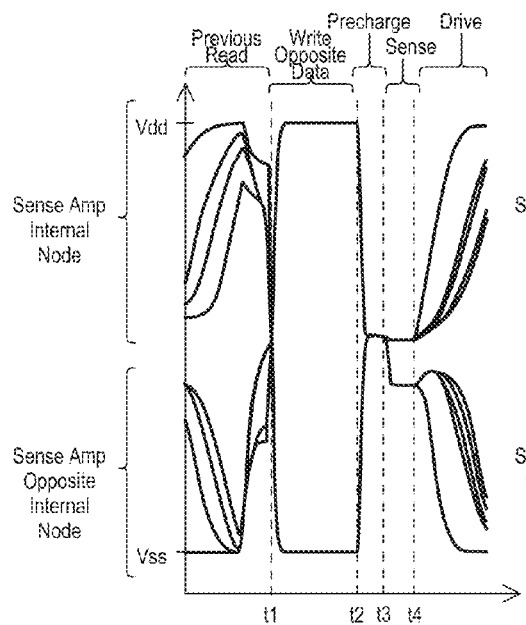
FIGS. 6A and 6B are timing diagrams showing responses with sense amplifiers having low threshold voltage (Vt) variation transistors, such as DDC transistors, as well as sense amplifiers with higher Vt variation transistors, such as conventional MOSFETs.

FIG. 6A shows voltage waveforms at the sense amplifier internal nodes in the presence of threshold voltage variations, when the threshold voltage variations (as measured by $\sigma V_T$ or transistor matching coefficient, AVT) are in predetermined range such that the sense amplifier read operations do not fail. The voltage waveforms are obtained from Monte Carlo simulations performed for the sense amplifier using DDC NMOS and DDC PMOS transistors. The sense amplifier read operation is determined to have failed if the sense amplifier reads a value that is opposite the value of the data stored in the DRAM cell connected to the sense amplifier, or the sense amplifier fails to amplify the bit lines to the full voltage values within a predetermined target time interval.

The voltage waveforms in FIG. 6A show the results obtained from 4096 Monte Carlo simulations, where at time t1 a write operation is initiated with the sense amplifier internal node SAINT driven to a high voltage level (corresponding to a logic value of "1"), and the sense amplifier opposite (i.e. complementary) internal node SAINT* is driven to a low voltage level. During the write operation, the word line is activated, and therefore, the DRAM cell capacitor connected to the SAINT node is charged to a high voltage level, i.e., a logic value of "1" is written into the DRAM cell corresponding to the activated word line.

At time t2, a read operation is initiated by first performing an equilibration operation. During the equilibration operation, using FIG. 5 as but one example, the sense amplifier internal nodes SAINT and SAINT* are both driven to mid-level, i.e., Vdd/2, and sensing operation can be disabled by driving node ACT and NLAT* towards the mid-level. The word line coupling the sense amplifier to the corresponding DRAM cell is not asserted during this time so the sense amplifier is isolated from the bit line and the DRAM cell.

At time t3, a sense operation is started by activating the word line. Activating the word line connects the DRAM cell capacitor to the bit line, and resulting charge sharing between the DRAM cell capacitor and the bit line to create a difference in voltages between the bit line pair based on a stored data value (i.e., the bit lines start to "split"). This voltage is reflected at the nodes SAINT or SAINT* of the sense amplifier.

At time t4, the sense amplifier can fire, driving the bit lines apart in the direction of the split. Thus, the bit line pair can be driven to (or toward) opposite driving limits of the sense amplifier (i.e., Vdd and Vss).

Figure 6B:
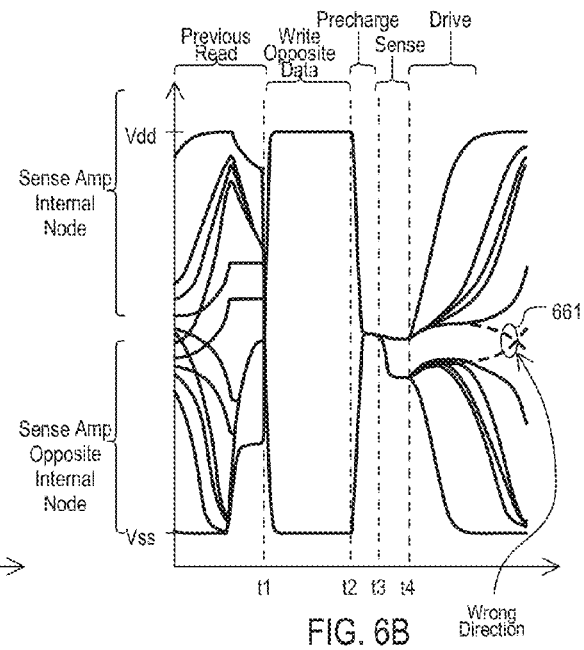

FIG. 6B shows voltage waveforms at the sense amplifier internal nodes in the presence of threshold voltage variations, such as those that can occur with the use of conventional transistors. Due to such threshold variations, sense amplifier read operations can start to fail. The voltage waveforms are obtained from Monte Carlo simulations performed for the same sense amplifier as in FIG. 6A, except for the higher values of $\sigma V_T$ (and AVT). The voltage waveforms in FIG. 6B show the results obtained from 4096 Monte Carlo simulations, where the operations performed at times t1, t2, t3, and t4, are the same as the operations performed at the corresponding times in FIG. 6A. As noted by the responses labeled "Wrong Direction" 661 in FIG. 6B, the sense amplifier read operation starts failing in the presence of the high threshold voltage variation as the sense amplifier internal nodes SAINT and SAINT* are driven in the wrong direction and the sense amplifier reads a value that is opposite the value of the data stored in the DRAM cell.

Figure 6C:
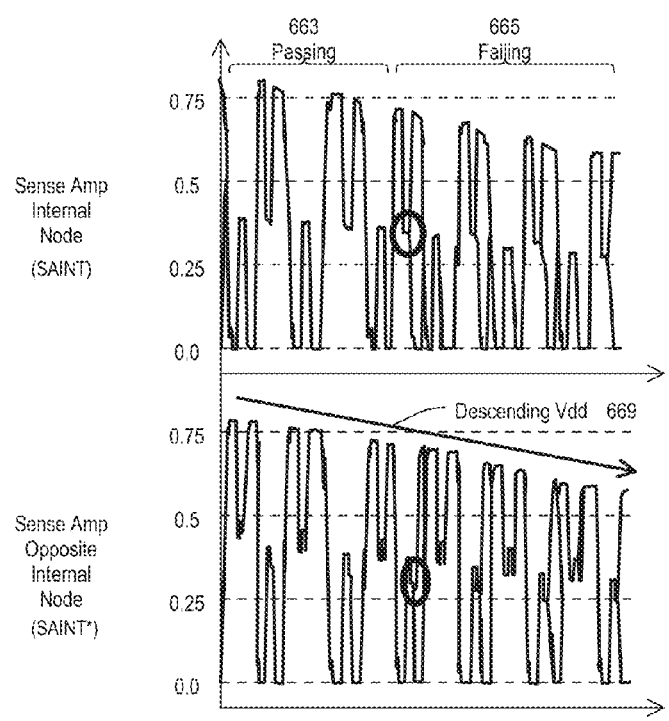
FIG. 6C is a timing diagram showing how a sense amplifier can fail as its power supply decreases.

FIG. 6C shows voltage waveforms at the sense amplifier internal nodes in the presence of threshold voltage variations as a power supply voltage Vdd is reduced. The voltage waveforms are obtained from Monte Carlo simulations performed for the same sense amplifier as in FIG. 6A, where a sequence of write and read operations (similar to the operations described in FIG. 6A) are performed consisting of a write operation that writes a logic "1" level to the DRAM cell and a subsequent read operation that senses the data stored in the DRAM cell, followed by a write operation that writes a logic "0" level to the DRAM cell and a subsequent read operation that senses the data stored in the DRAM cell. These alternate write and read operations continue as the value of Vdd is reduced. The top waveform shows one sense amplifier node (e.g., SAINT), while the other waveform shows the opposite sense amplifier node (e.g., SAINT*). The top waveform shows region "Passing" 663 and "Failing" 665. Region "Passing" 663 represents sense amplifier operations that correctly sense a stored data value. Region "Failing" 665 shows where sense amplifier operations fail, with nodes (SAINT and SAINT*) switching to value opposite to that stored in a DRAM cell. The bottom waveform shows how Vdd is reduced 669.

From FIG. 6C it can be understood that as variation in threshold voltage is increased, a "Failing" region 665 will start at a higher Vdd. Consequently, inclusion of low threshold voltage variation DDC transistors may enable sense amplifiers to operate at lower power supply voltages than those with conventional transistors.

Figure 7:
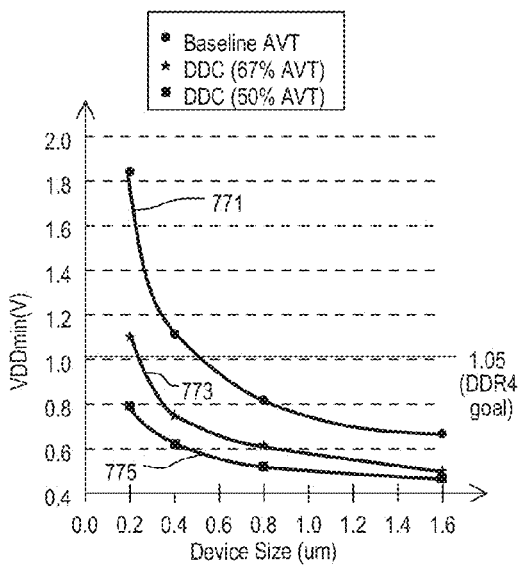
FIG. 7 is a graph showing a minimum sense amplifier supply voltage for sense amplifiers having low threshold voltage (Vt) variation transistors, such as DDC transistors, as compared to a sense amplifier having higher Vt variation transistors, such as conventional MOSFETs.

FIG. 7 shows sense amplifier simulation results reflecting the relationship shown in FIG. 6C for minimum power supply voltages (VDDmin) for sense amplifier circuits versus their transistor size (Device width). FIG. 7 includes three sets of results: "Baseline AVT" (771) corresponding to sense amplifiers with transistors having conventional AVTs, "DDC (67%)" (773) corresponding to a sense amplifiers with transistors having AVTs that are 67% of that of the Baseline AVT, and "DDC (50%)" (775) corresponding to a sense amplifiers with transistors having AVTs that are 50% of that of the Baseline AVT. The value of VDDmin shown in FIG. 7 is obtained from Monte Carlo simulations similar to that described with reference to FIG. 6C. It is noted from the figure that lower AVT can result in a reduced VDDmin of at least 25% or more as compared with the baseline. Further, FIG. 7 shows how DDC based sense amplifiers can operate within VDDmin values well within expected standards for DRAM integrated circuits, such as 1.05 V for the DDR4 SDRAM standard.

As noted previously, inclusion of DDC transistors within sense amplifiers can enable a same sense amplifier to service a greater load capacitance (i.e., longer bit line) than a conventional DRAM. Such a capability is represented by FIG. 8.

Figure 8:
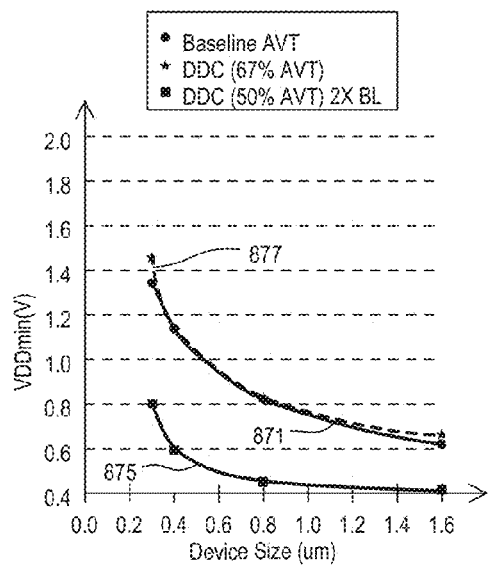
FIG. 8 is a graph showing how a sense amplifier with low threshold voltage (Vt) variation transistors, such as DDC transistors, can accommodate larger bit lines than a sense amplifier having higher Vt variation transistors, such as conventional MOSFETs.

FIG. 8 shows simulation results like those of FIG. 7, plotting VDDmin values versus transistor size including a "Baseline AVT" (871) and a "DDC (50% AVT)" (875) waveform. It is understood that these results correspond to sense amplifiers driving a first bit line capacitance. However, FIG. 8 further includes a waveform "DDC (50% AVT) 2×BL" waveform corresponding to a sense amplifier driving at twice the bit line capacitance as that of the "DDC (50% AVT)" 875 results. The values of VDDmin shown in the figure are obtained from Monte Carlo simulations similar to that described with reference to FIGS. 6C and 7. It can be observed from these curves that the sense amplifier using 50% lower AVT transistors can accurately sense the voltage levels on a bit line that is connected to a greater number of DRAM cells, as represented by the VDDmin curve for a bit line having twice the capacitance. Typically, for every 10% reduction in AVT, the sense amplifier can accurately sense the voltage levels on a bit line that is connected to 5-20% more DRAM cells (i.e., a 5-20% increase in bit line length).

Figure 9:
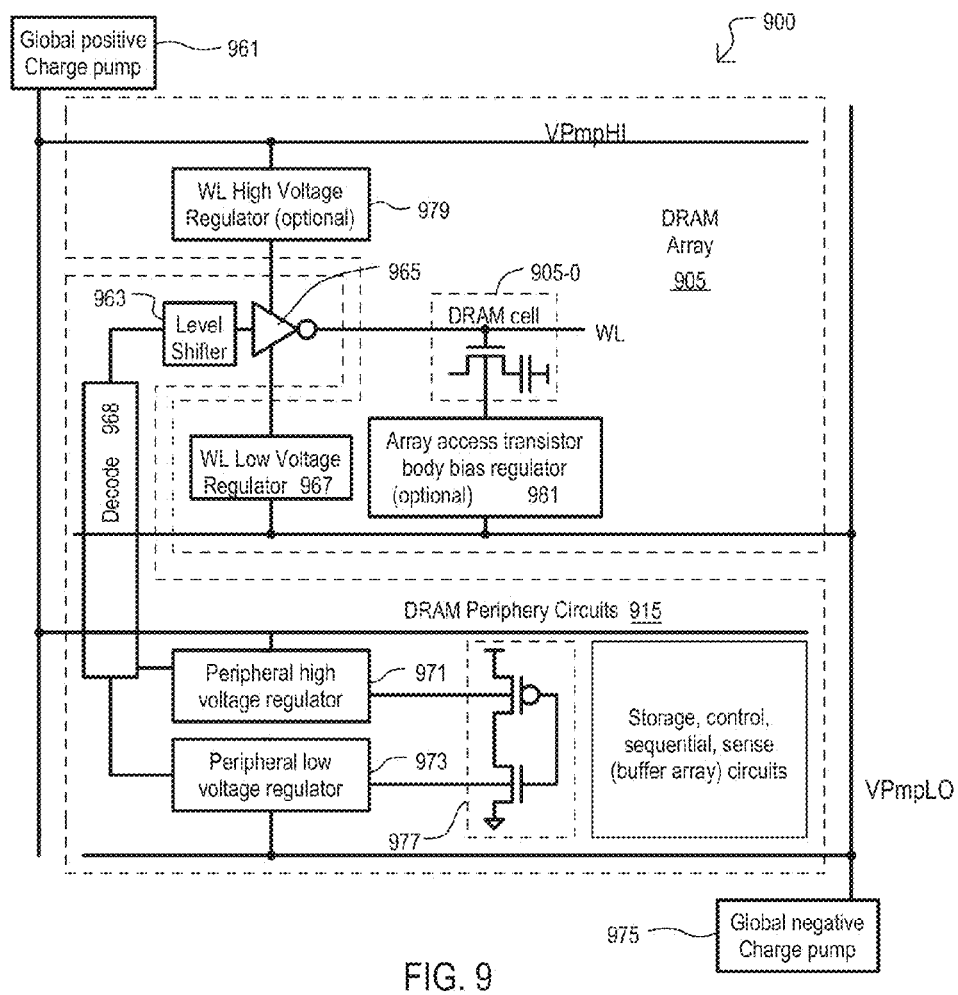
FIG. 9 is a block diagram of a DRAM according to a further embodiment.

In still other embodiments, as seen with respect to FIG. 9, DRAM circuits according to embodiments can include body biasing of DDC transistors within peripheral circuits.

FIG. 9 shows a DRAM 900 having a global positive charge pump 961 and a global negative charge pump 975 that can apply body bias voltages to a DRAM array 905 and peripheral circuits 915. DRAM array 905 can include a number of DRAM memory cells (one shown as 905-0) connected to word lines (one shown as WL) as well as a word line low voltage regulator 967. A word line low voltage regulator 967 can receive a low charge pump voltage VPmpLO from global negative charge pump 975, and regulate it to provide a regulated low voltage to word line driver 965.

Peripheral circuits 915 can include word line drivers (one shown as 965), level shifter (one shown as 963), decoder 968, peripheral high voltage regulator 971, peripheral low voltage regulator 973, and peripheral circuits 977. A word line driver 965 can drive a word line (WL) to thereby access a memory cell 905-0. A level shifter 963 can shift a select signal from decoder 968, to provide a drive signal to word line driver 965. A decoder 968 can be a word line decoder that selects a word line to be driven based on address information (i.e., access or refresh operation). A peripheral high voltage regulator 971 can receive voltage VPmpHI from global positive charge pump 961, and regulate such a voltage to provide a body bias voltage to p-channel devices within peripheral circuits 915, where such p-channel devices can be DDC transistors. Similarly, a peripheral low voltage regulator 973 can receive voltage VPmpLO from global negative charge pump 975, and regulate such a voltage to provide a body bias voltage to n-channel devices within peripheral circuits 915, where such n-channel devices can be DDC transistors. It is understood that such voltage regulation can include static and/or dynamic control of body bias levels. Peripheral circuit 977 can be any peripheral circuit of a DRAM integrated circuit.

Optionally, a DRAM 900 can include a word line high voltage regulator 979 and/or access transistor body bias regulator 981. A word line high voltage regulator 979 can receive a high charge pump voltage VPmpHI from global positive charge pump 961, and regulate it to provide a regulated high voltage to word line driver 965. Access transistor body bias regulator 981 can receive a low charge pump voltage VPmpLO from global negative charge pump 975, and regulate it to provide a body bias voltage to access transistors within memory cells 905-0 of DRAM array 905.

In the embodiment of FIG. 9, a DRAM 900 can include array body bias voltages and word line (WL) voltages that are both derived from the same charge pump voltage. In particular, global positive charge pump 961 can generate a bias supply voltage VPmPHI, which can be used by word line high voltage regulator 979 to generate a high word line voltage, as well as peripheral high voltage regulator 971 to generate a p-channel body bias voltage for DDC p-channel devices within peripheral circuits 977. In other embodiments, charge pump voltages (e.g., VPmpHI, VPmpLO) can be used to generate body bias voltages for various other circuits in the DRAM array 905 and periphery (including decoders, which reside in both the periphery and partially in the arrays). VPmpHI may be externally supplied, either external to the block or may be external to the integrated circuit die.

In the embodiment of FIG. 9, DRAM circuits can support reverse body bias for low leakage, which can be critical to meet power requirements in many products. However, since DRAMs already use a positive charge pump for the high WL voltage (which is typically beyond the single power rail, e.g., 2V vs. VDD=1.2 V for a DRAM operating according to a DDR3 or similar standard), it is desirable to not add more charge pumps. Since the body bias needed to alter performance of DDC transistors is more modest than that of many conventional transistors (e.g., on the order of between about 0 and 0.6V beyond the rail), a same charge pump used to generate a high WL voltage can also be used to generate PMOS reverse body biases with reasonable efficiency.

Accordingly, as shown in FIG. 9, a global positive charge pump 961 can serve as a source for a high drive voltage of word line driver 965, and at the same time, provide a source voltage to peripheral high voltage regulator 971, to derive a p-channel body bias voltage (VBBP).

While embodiments that include DDC transistor body bias circuits can provide for discrete applied body bias, for instance, at test, or may include dynamic control of DRAM body bias voltages based on mode of operation. For instance, during a power up of a DRAM integrated circuit, charge pumps may not initially be fully functional, or may not generate an adequate charge pump voltage. According to embodiments, body bias voltages, derived from charge pump voltages during standard operations, can be clamped to a power supply level (i.e., rails) during an initial power up period. Once charge pump operations are stabilized, such body bias voltages can be connected to charge pump outputs. In particular embodiments, such operations can ensure wells are not forward biased on power-up.

FIG. 10 is a block schematic diagram of a body bias control circuit 1071 for p-channel transistors according to an embodiment. Such a circuit can serve as, or be included in, a peripheral high voltage regulator circuit, such as that shown as 971 in FIG. 9. Body bias control circuit 1071 can include local body bias circuits 1081 and a collapse circuit 1089. A local body bias circuit 1081 can be a regulator circuit connected to a reference voltage (Vref) on reference line 1083, a global charge pump voltage (Vglobal) (which can correspond to VPmpHI, in some embodiments) on global supply line 1085, and a p-channel body bias voltage (VBBP) on body bias line 1087. In operation, local body bias circuit 1081 can establish a value of VBBP based on Vref, using Vglobal as a voltage source.

A reference voltage (Vref) carried on a reference line 1083 can be for transistors of one section, or multiple sections of DRAM peripheral circuits. As noted above, a reference voltage (Vref) can establish a body bias voltage VBBP for p-channel devices. In the very particular embodiment shown, a reference voltage Vref can be less than a global body bias voltage Vglobal.

A collapse circuit 1089 can ensure that body bias of p-channel devices are connected to a power supply level VDD (on power supply line 1093) upon power up. A signal Coll_EN can enable collapse circuit 1089. Accordingly, during an initial part of power on, Coll_EN can be active, connecting VBBP (1087) to VDD (1093). Once charge pump circuits are able to provide stable voltage, Coll_EN can be de-activated, allowing a body bias voltage VBBP to be established with local body bias circuit 1081.

FIG. 11 shows a body bias control circuit 1171 for p-channel transistors according to another embodiment. The circuit of FIG. 11 can be one very particular implementation of that shown in FIG. 10. Like sections are referred to with the same reference characters but with the first digits being "11" instead of "10".

In FIG. 11, a local body bias circuit 1181 can be a low dropout regulator (LDO) type circuit, and can include an amplifier 1138 and a bias device 1136. An amplifier 1138 can have a (−) input connected to receive reference voltage (Vref), a (+) input connected to receive the generated body bias voltage VBBP (i.e., a feedback value), and an output that drives the bias device 1136. A bias device 1136 can be a p-channel transistor having source and body connected to receive a global body bias value (Vglobal), a gate coupled to the output of amplifier 1138, and a drain connected to provide the body bias voltage (VBBP) on body bias line 1187 (i.e., the drain is connected to one or more wells or other active regions containing p-channel transistors). A global body bias voltage (Vglobal) can be provided on a global body bias network 1183, which can provide such a value to multiple different blocks. In particular embodiments, a bias device 1136 can be a high voltage transistor (i.e., a transistor designed to withstand higher voltage levels than other transistors of the IC device, such as a thicker gate insulator, for example).

According to a difference between Vref and VBBP, amplifier 1138 can drive bias device 1136 to raise or lower VBBP with respect to Vglobal. In particular, as VBBP falls below Vref, amplifier 1138 will increase the conductivity of bias device 1136 until VBBP reaches a desired level.

A collapse circuit 1189 can include a collapse device 1140. A collapse device 1140 can drive VBBP to a power supply level VDD in response to signal Coll_EN. A power supply (VDD) level can be lower than VBBP during normal operations.

To avoid large current draw through device 1136 (a contention state) the body bias control circuit may have a disable asserted when Coll_EN is asserted.

It is understood that while the above embodiments show p-channel biasing circuits, alternate embodiments can include n-channel biasing circuits.

In this way, peripheral circuits of DRAM can have transistors, such as DDC transistor having body bias voltages that can be clamped to a power supply level during an initial power on period.

As noted above, embodiments include DRAM peripheral circuits with DDC transistors that can have dynamic body biasing. FIGS. 12A and 12B show such dynamic body biasing according to a very particular embodiment.

FIG. 12A is a block diagram of a DRAM integrated circuit 1200 according to an embodiment. A DRAM integrated circuit 1200 can include one or more DRAM arrays 1205, one or more peripheral circuits 1215-0 to 1215-3, and a dynamic bias control circuit 1291. In the particular embodiment shown, peripheral circuits can include a sense amplifier circuit 1215-0, a write driver circuit 1215-2, a signal propagation path 1215-3, and optionally, a secondary sense amplifier circuit 1215-1. Each peripheral circuit (1215-0 to 1215-3) can receive one or more body bias voltages (VBB1 to VBB4). Such body bias voltages can have the same or different levels, and can be for n-channel transistor bodies and/or p-channel transistor bodies. Within each peripheral circuit (1215-0 to 1215-3) the received body bias voltage(s) (VBB1 to VBB4) can be applied to the bodies of DDC transistors.

Sense amplifier circuits 1215-0 can include any suitable sense circuit for sensing a DRAM cell data value, including those shown herein, and equivalents. Write driver circuits 1215-2 can drive data values in response to received read data. Write driver circuits 1215-2 can include any suitable write driver circuits. It is understood that write drivers 1215-2 can drive data through column decoder/MUX circuits (not shown). A secondary sense amplifier circuit 1215-1 can drive input/output lines according to data values sensed by sense amplifier circuits 1215-0. A signal propagation path 1215-3 can propagate a signal from one area of DRAM integrated circuit 1200 to another area, from an input to an area of DRAM integrated circuit 1200, or from an area of DRAM integrated circuit 1200 to an output.

Bias control circuit 1291 can dynamically vary any or all body bias voltages (VBB1 to VBB4) in response to indications (IND). Indications (IND) can include, but are not limited to: modes of operation, configuration values, operating conditions (e.g., power supply voltages, temperatures), or process variations. Body bias voltages can be varied to increase speed (e.g., lower threshold voltages) or decrease leakage (e.g., increase threshold voltages).

FIG. 12B shows a dynamic body bias control operation according to one very particular embodiment. FIG. 12B is a timing diagram showing an indication (IND), an n-channel body bias VBBN, and a p-channel body bias VBBP. FIG. 12B shows an operation in which forward body bias voltages are provided, to increase transistor speed, for example.

At time t0, in response to an indication, a body bias control circuit can begin varying body bias values (VBBN and VBBP). In the embodiment shown, an n-channel body bias voltage (VBBN) can be driven above a low power supply level (VSS) while p-channel body bias voltage (VBBP) can be driven below a high power supply voltage (VDD). In one very particular embodiment, body bias voltages (VBBN, VBBP) can provide forward body bias voltages for a sense amplifier in response to an expected access operation (i.e., bank select signal, or refresh indication).

At time t1, in response to the indication, body bias voltages can return to previous levels.

In alternative embodiments, in response to an indication, a body bias voltage can be driven to a reverse body bias and/or clamped to a power supply level in response to an indication.

Body biasing of DDC transistors can be applied to various circuits including peripheral DRAM circuits. According to some embodiments, such peripheral circuits can include timing circuits, such as delay locked loops, digital delay lines, and phase locked loops. The strong body coefficient of DDC transistors can enable very high resolution and simple digital delay lines that can be used in DRAM clock/data recovery circuits.

Figure 13:
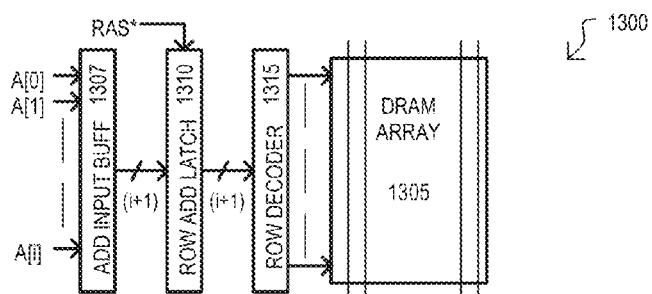
FIG. 13 is a block diagram of a DRAM according to another embodiment.

FIG. 13 is a block diagram of a DRAM 1300 according to an embodiment. A DRAM 1300 can include sections like those of FIG. 2A, and such like sections are referred to with the same reference character but with the leading digits being "13" instead of "2".

FIG. 13 differs from FIG. 2A in that it includes a digital delay line circuit 1331 that can delay a clock signal (CLK) according to clock control values CLK CTRL to generate various timing signals for the DRAM 1300. In the embodiment shown, timing signals include a data strobe signal (Data Strobe) and one or more other clock signals (CLK_Other). A digital delay line circuit 1331 can include DDC transistors. In some embodiments, such transistors, due to low threshold variation, can provide accurate delay stages. In addition or alternatively, due to the increased body coefficient, DDC transistors can enable a wider adjustment of delays by varying a body bias voltage.

Figure 14:
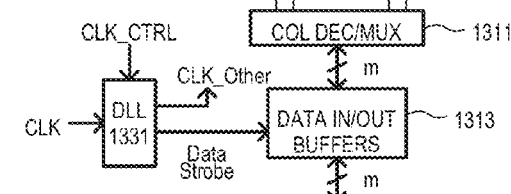
FIG. 14 is a block diagram of a digital delay line circuit according to an embodiment.

FIG. 14 shows a digital delay line circuit 1400 according to one embodiment. A digital delay line circuit 1400 can provide coarse delay settings, in combination with fine delay settings, to set the delay of a signal CLK to generate a signal CLKOUT. A digital delay line circuit 1400 can include a coarse section 1443 and a fine section 1445. A coarse section 1443 can include a number of stages that can be separately enabled to establish a coarse delay. In the particular embodiment shown, a coarse section 1443 can include a series of non-inverting multiplexers (one shown as 1447). In some embodiments, transistors of a coarse section 1443 may not include any body bias. For other implementations, particularly for embodiments lacking a triple well and wherein body bias is used, a p-channel body bias is omitted, or a p-channel forward body bias can be applied to improve speed performance. The clock input point chooses the start of the line (and hence its length and delay). A clock input point can be determined by a coarse delay control circuit 1449.

A fine section 1445 can rely on body biasing of transistors, such as DDC transistors, to enable finer adjustments to a delay than those achievable with coarse section 1443. In the particular embodiment shown, a fine section 1445 can include a set of delay inverters (one shown as 1451) arranged in series, that are periodically tapped via tap inverters (one shown as 1453). Any of tap inverters 1453 can be selected with delay select MUX 1455, to arrive at a final delay (CLKOUT). A body bias of delay inverters 1451 can be varied by operation of fine delay control 1459, to arrive at desired fine delay increments.

According to embodiments, a length of a fine delay chain 1457 can be chosen to center a fine delay so that with a mid-range p-channel body bias voltage (set by the output of the fine delay control 1459), a delay can be in the middle of coarse delay step. In some embodiments, a fine delay control 1459 can include a digital-to-analog converter (DAC) that drives a p-channel body bias of devices within the fine delay chain 1457. One particular tuning configuration is shown in FIG. 15.

Figure 15:
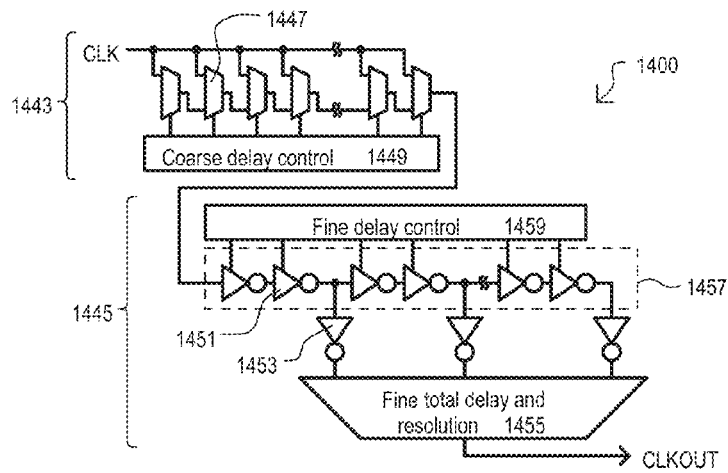
FIG. 15 is a graph showing coarse and fine body bias tuning ranges for a digital delay line according to an embodiment.

FIG. 15 is a graph showing fine delay settings (vertical axis) with reference to coarse delay settings (bottom horizontal axis). A final delay, in picoseconds, is shown by a top horizontal axis. By adjusting a body bias of devices within inverter chain 1457 (e.g., p-channel body bias voltage) a fine delay can be adjusted down and up, such that a step to the next coarse delay can be made with minimum jitter put onto the output clock.

Referring back to FIG. 14, the step magnitude of the coarse delay can be set by the location of the clock input in coarse section 1443, while the step magnitude of the fine delay can be tuned by changing the length of the fine delay inverter chain via the multiplexer 1455. Ideally, the fine tuning range can span at least one coarse tuning delay range, including variation due to process corners and random variation across all temperatures. A broad fine tuning delay range is of particular use with devices that minimize process corner variation, usually achieved by lengthening the devices. However, increasing transistor length can increase a delay. A broader fine tuning delay range can be achieved using DDC transistors instead, to avoid a delay increase from otherwise longer transistors. DDC transistors, particularly with body biasing for corner pull-in can provide fine delay increments falling within a desired delay range.

In very particular embodiments, a digital delay line circuit according to embodiments can be used for data recovery and transmission on a double data rate (DDR) (or wide-IO) channels. It is understood that the coarse and fine delay approaches, as described herein, can be used on other timing circuits including stages, such as ring oscillators used in phase locked loops.

Figure 16:
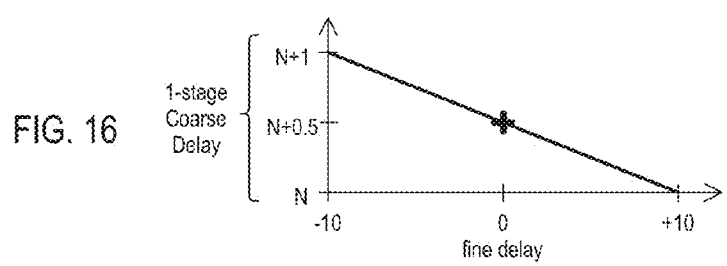
FIG. 16 is a graph showing coarse and fine body bias tuning ranges for a digital delay line according to another embodiment.

FIG. 16 shows delay adjustment according to another embodiment. A course delay is shown on a Y-axis (coarse delay provided by one coarse delay stage) versus a fine delay shown on an X-axis. According to some embodiments, a coarse delay can be an even increment of fine delays. In the particular embodiment shown, at −10 fine delays, a fine adjustment can go back to 0, while the number of coarse delays can be incremented. Use of DDC transistors can enable such granularity in fine delays, due to the reductions in random variations of the devices.

However, due to variations in process, coarse and fine delays may vary (i.e., stages may have longer delays at slow process "corners" and shorter delays at fast process corners). According to embodiments, adjustments can be made to ensure coarse delays correspond to predetermined numbers of fine delays.

Figure 17:
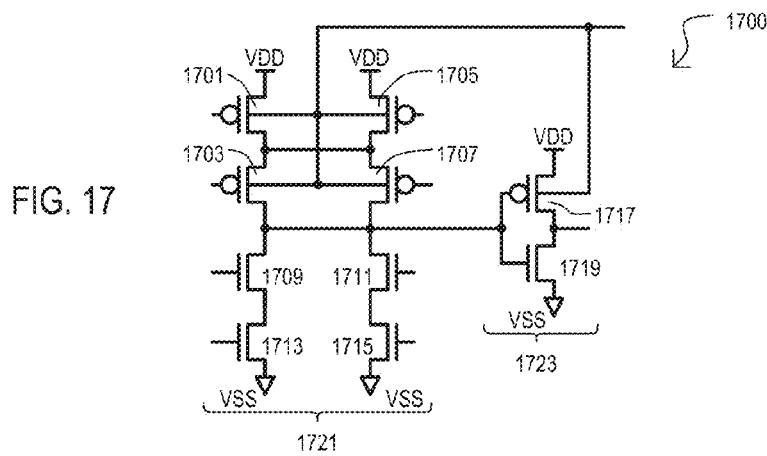
FIG. 17 is a schematic diagram of a tunable delay stage for a coarse delay circuit according to an embodiment.

FIG. 17 shows a coarse delay stage 1700 having a delay adjustment according to one particular embodiment. A coarse delay stage 1700 can include a MUX section 1721 and a driver section 1723. An amount of p-channel body bias (in particular embodiments, a forward body bias) can be adjusted to alter the delay of the coarse delay line until it is at the target delay per stage (i.e., a set number of fine delays). As shown, the PMOS speed can be adjusted (we assume here that the NMOS is in the substrate and does not have triple well) to compensate for the NMOS and PMOS as-fabricated process corners to give the desired target delay. In some embodiments, a p-channel body bias can be a forward body bias that ranges from VDD (no forward body bias) to up to about 0.5V below VDD (full forward body bias). Such a range of body biases can enable an overall delay of a stage 1700 to hit the target per-stage delay.

In addition or alternatively, a fine delay range/length can be tuned to match the coarse delay, as fabricated. This can include changing the number of DAC counts positive or negative, or changing the calibration point where the fine delay DAC ends to match the coarse delay. It is noted that whether the coarse delay is calibrated or not, matching the fine delay range to the coarse delay per stage is desirable. This can be accomplished by setting the delta delay between the fine delay zero body bias case and the fine delay maximum forward body bias case (i.e., the full range of the fine delay line) to match the coarse single-stage delay (whether the coarse delay is calibrated first or not).

In some embodiments, it may be useful to have a relatively fast response speed in a body bias node. Accordingly, some embodiments can include a body bias node driver circuit 1800, like that shown in FIG. 18. In such an arrangement, a DAC circuit 1825 may not have an output directly connected to a body bias node (VBBP), but can include an analog buffer 1827. In some embodiments, existing circuit design IP can be incorporated into a DRAM integrated circuit to implement a DAC and analog buffer.

While embodiments can include digital delay lines for implementing various signals within a DRAM integrated circuit, in particular embodiments, digital delay lines as described herein can be used to generate a sample clock for double data rate (DDR) DRAM. A DDR timing and sample clock circuit are shown in FIGS. 19 and 20.

Figure 19:
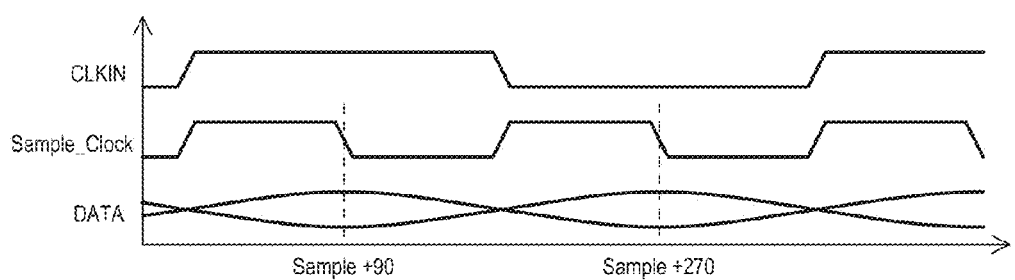
FIG. 19 is a timing diagram showing sample clocks for a double data rate (DDR) DRAM.

FIG. 19 is a timing diagram showing an input clock (CLKIN), a resulting sample clock (Sample_Clock), and an "eye" pattern showing the timing of data to be sampled (DATA). DDR data moves at twice the clock rate, i.e., transitions in synchronism with both rising and falling edges of the clock CLKIN. As shown, a Sample_Clock can provide quadrature clocks from the incoming clock so that the data may be sampled in the middle of the DATA "eye" where the signal is greatest.

Figure 20:
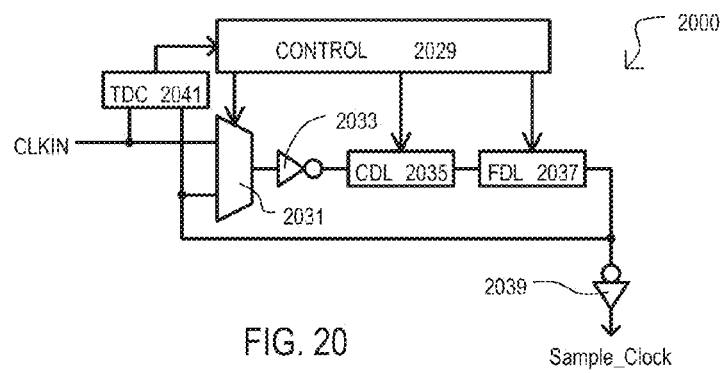
FIG. 20 is a block schematic diagram of a DDR sample clock generator circuit according to an embodiment.

FIG. 20 is a block diagram of a digital delay circuit 2000 according to an embodiment. Digital delay circuit 2000 can include a control circuit 2029, a MUX 2031, driver 2033, a coarse delay section 2035, a fine delay section 2037, an output driver 2039, and a time to digital converter (TDC) 2041. Coarse and/or fine delay sections (2035, 2037) can take the form of any of those described herein, or equivalents.

By operation of control circuit 2029, a rising edge of the CLKIN signal is allowed through the MUX 2031, where the coarse and then fine delay sections (2035, 2037) generate the quadrature clocks. In this particular design, the digital delay circuit output (i.e., output of fine delay section 2037) can be fed back three times, under control of control circuit 2029, to generate two sample edges that are 90 and 270 degrees out of phase with the incoming edge of the clock (CLKIN). At each incoming clock edge, the TDC 2041 can measure a phase difference of the fourth clock edge against the next incoming clock. Control circuit 2029 can then add or subtract fine delay (or coarse delay if the fine delay is approaching the next coarse increment) to more closely approximate the frequency/phase of the incoming clock, and better center the sample clock transitions at the desired position (e.g., 90 and 270 degrees).

Figure 21:
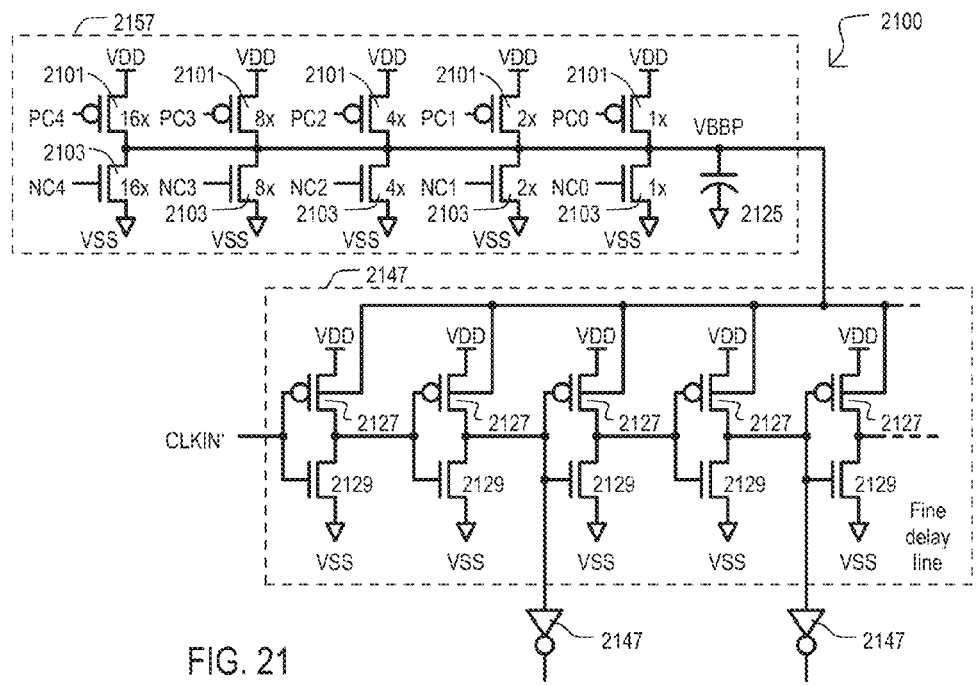
FIG. 21 is a block schematic diagram of a fine delay line circuit according to an embodiment.

FIG. 21 shows a fine delay line circuit 2100 according to a very particular embodiment. A fine delay line circuit 2100 can include a fine delay chain 2147 and fine delay control 2157. A fine delay control 2157 can be a DAC circuit that provides a p-channel body bias to the p-channel devices within delay chain 2147. In particular embodiments, the body bias can be a forward body bias (FBB).

FIG. 21 shows a fine delay control 2157 that includes a DAC implemented as various stages that each include a p-channel transistor and an n-channel transistor (2101/2103), but of different sizes. As is well understood, such different sizes can correspond to binary bit, with the largest devices corresponding to a most significant bit. A capacitor 2125 can be charged to generate a body bias voltage VBBP.

Turning on p-channel devices 2101 can increase a body bias, while turning on n-channel devices 2103 can decrease a body bias.

In particular embodiments, a DAC can be centered for a fabrication process corner and/or temperature by modifying the PMOS (2101) selection. The NMOS selection (2103) determines the body bias and resultant fine delay. To initialize the range, all NMOS devices (2103) can be turned on, and the PMOS devices (2101) can be selectively turned on to give a full FBB range (e.g., VDD-0.5V). Then, the NMOS devices (2103) can be ½ turned on, (e.g., binary 15 of 31) and extra inverters (not shown) can be set to center the timing in the coarse delay. Fine tuning can be provided by increasing or decreasing the number of NMOS devices (2103) that are turned on.

Figure 18:
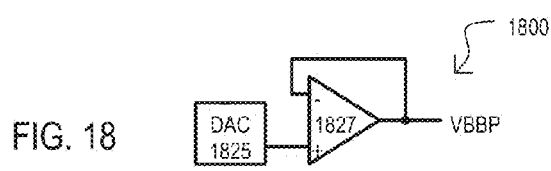
FIG. 18 is a block schematic diagram of a body bias drive circuit that can be included in embodiments.

It understood that FIG. 21 shows but one implementation of a DAC circuit within a fine delay control, alternate embodiments can include any suitable DAC circuits, as well as body bias node driver circuits, like that shown in FIG. 18, or an equivalent.

Figure 22A:
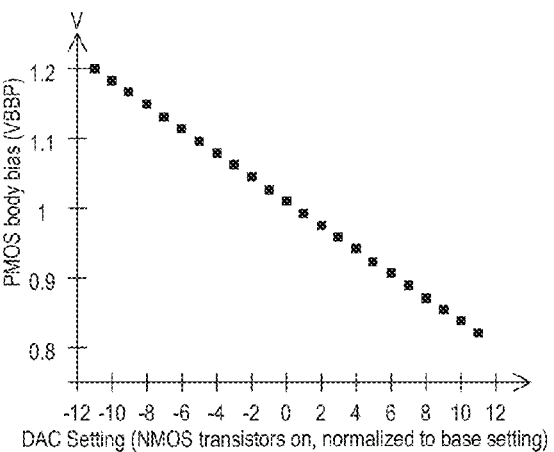
FIGS. 22A and 22B are diagrams showing programmable delay responses for a circuit like that shown in FIG. 21.

FIG. 22A is a graph showing a fine tuning range of a PMOS forward body bias voltage (VBBP) corresponding to a DAC setting (input value), for a fine delay line circuit like that of FIG. 21. In FIG. 22A, VDD can be 1.2 V, thus the various biases show a forward body bias.

Figure 22B:
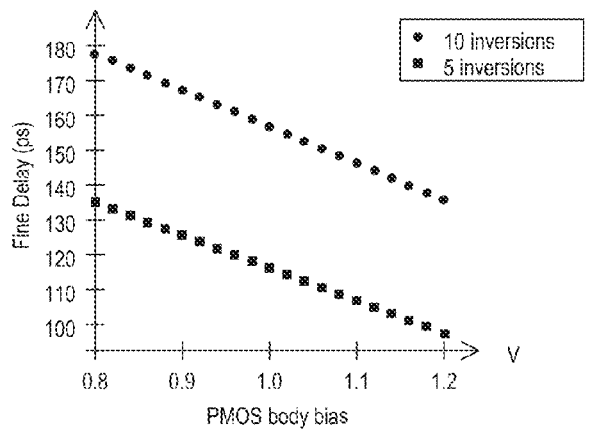

FIG. 22B shows a delay response corresponding to body bias voltage. In particular, FIG. 22B is a graph showing delay for various inverter stages versus a p-channel body bias for DDC transistors. FIG. 22B includes one set of responses for 10 stages (10 inversions) and one set of responses for five stages (5 inversions).

As shown by FIGS. 22A and 22B, responses can give a high degree of linearity to enable accurate setting of a delay.

Figure 23:
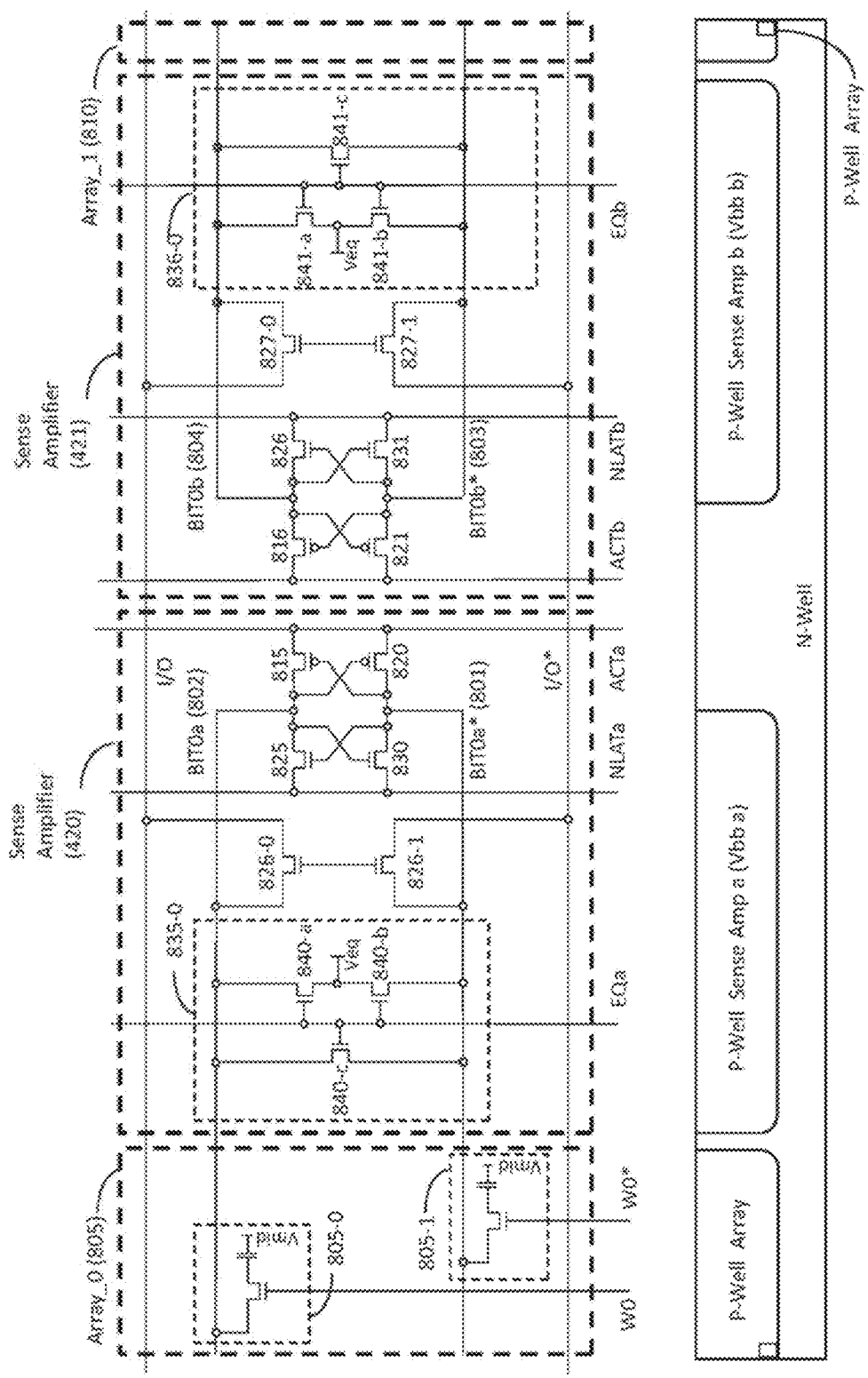
FIG. 23 is a schematic diagram of an alternative embodiment of a portion of a DRAM integrated circuit.

FIG. 23 is an embodiment of an additional design approach that can be used for sense amplifier 420 and 421 of FIG. 4. Sense amplifier block 420 can be connected to array_0 805 and sense amplifier block 421 to Array_1 810 which can be DRAM arrays. Each DRAM array 805 and 810 contains multiple bit cells on each bit line, as exemplified by bit cells 805-0 and 805-1 in Array_0(805). In this example, when cell 805-0 is being accessed, W0 is enabled and W0* is held in the off state. As a result, the data in 805-0 will be read onto BIT0a, while BIT0a* is not being driven by any selected bit cells, thus remaining at the Veq level provided by the precharge operation of transistors 840 (a, b, and c) Sense amplifier 420 may be designed as a pair of cross-coupled sensing portions typified by transistors 815, 820, 825 and 830, while sense amplifier 421 is made up of transistors 816, 821, 826 and 830. Transistors 820 and 830 are coupled to bit line BIT0a* (801) and transistors 825 and 815 are coupled to bit line BIT0a (802). Transistors 821 and 831 are coupled to bit line BIT0b* (803) and transistors 816 and 826 are coupled to bit line BIT0b (804). Each of bit lines BIT0a* (801) and BIT0a (802) run between their respective sense amplifier nodes and link there to a pass gate transistor to the global I/O lines, as well as equilibrium circuit region to ultimately connect to the DRAM array. More specifically, bit line BIT0a* (801) connects to pass gate device 1 826-1 and equilibrium circuit 835-0 and connecting to DRAM access transistor 805-1. Bit line BIT0a (802) connects to pass gate device 2 826-0 and equilibrium circuit 835-0 and connecting to DRAM access transistor 805-0. Bit line BIT0b* (803) connects to pass gate device 1 827-1 and equilibrium circuit 836-0 and further connects to DRAM array Array_1 (810). Bit line BIT0b (804) connects to pass gate device 2 827-0 and equilibrium circuit 836-0 and further connects to DRAM array Array_1 (810). Equilibrium circuit 835-0 contains equilibration transistors 840-a, 840-b, and 840-c, which are driven by an equilibrium enable signal EQa to short bit lines BIT0a and BIT0a* to each other and to equilibration voltage Veq. Equilibrium circuit 836-0 contains equilibration transistors 841-a, 841-b, and 841-c, which are driven by an equilibrium enable signal EQb to short bit lines BIT0b and BIT0b* to each other and to equilibration voltage Veq Preferably, such dual sense-amplifier design is built in a single N-well supporting the p-channels of each of sense amplifiers 420 and 421. The p-wells for the two sense amplifiers are separated from each other and also separated from the p-wells of the bit cell arrays. This allows the p-wells of the bit cell arrays to remain fixed at their optimum voltages, as determined by the bit cell designs, while allowing either the p-well for sense amp 420 or the p-well for sense amp 421 to move individually to adjust Vt separately for sensing and low leakage data retention, in an embodiment where the p-well is operated at two different voltages. In another embodiment, the n-channel source voltages NLATa or NLATb can be varied individually to create substantially the same effect. In such an embodiment, the p-well voltages will remain fixed, but preferably at a different bias point than the p-well voltages of the bit cell arrays.

The embodiment at FIG. 23 is but one example of a design by which sense amplifiers can be used for dual purpose of sensing and data storage. After sensing, the sense amplifiers may be used as storage for ready access of the data to the high bandwidth I/O's. In the sensing mode, a low or zero body bias can be used to facilitate fast sensing and minimize mismatch. In the storage mode, a larger (more negative for NMOS and/or more positive for PMOS) body bias can reduce leakage in the sense amplifiers when they are acting as storage latches in such a buffer capacity.

Multiple well biases can also be advantageous in other contexts without there being a dual sensing architecture. For instance, multiple well biases can be used when the sense amplifiers are in different memory banks. In an embodiment, the sensing/storage transistors (for instance, as shown in FIG. 23 transistors 815, 820, 825, 830) may be in one well bias, e.g., for standby, while other devices, e.g., readout transistors (for instance, as shown in FIG. 23 transistors 826-0, 826-1) may be in another well bias. This can be achieved by simply allocating the devices in one sense amplifier to different P wells as in FIG. 23 (i.e., sense/storage in Vbb a, readout in Vbb b).

Effective operation of a dual purpose sense amplifier can be achieved by either applying source control or by applying well control. In either case, if DDC transistors are used for at least some of the transistors for the sense amplifier, then the DDC transistors can be targeted to operate with one threshold voltage, and applied body bias can be used to modulate the threshold voltage to enable the DDC transistors to change from low-voltage, high sensitivity devices for sensing, to low-leakage (higher threshold voltage) devices more amenable for data storage as latch circuitry. The flexibility accorded by using DDC devices allows for applied body bias to set up a dual purpose scheme, to enable a reduction in the number of transistors used for the sense amplifier block. Additionally, with the scheme of achieving the body bias control by controlling either the source or the well, increased design options are enabled due to the increased flexibility for layout schemes.

Figure 24:
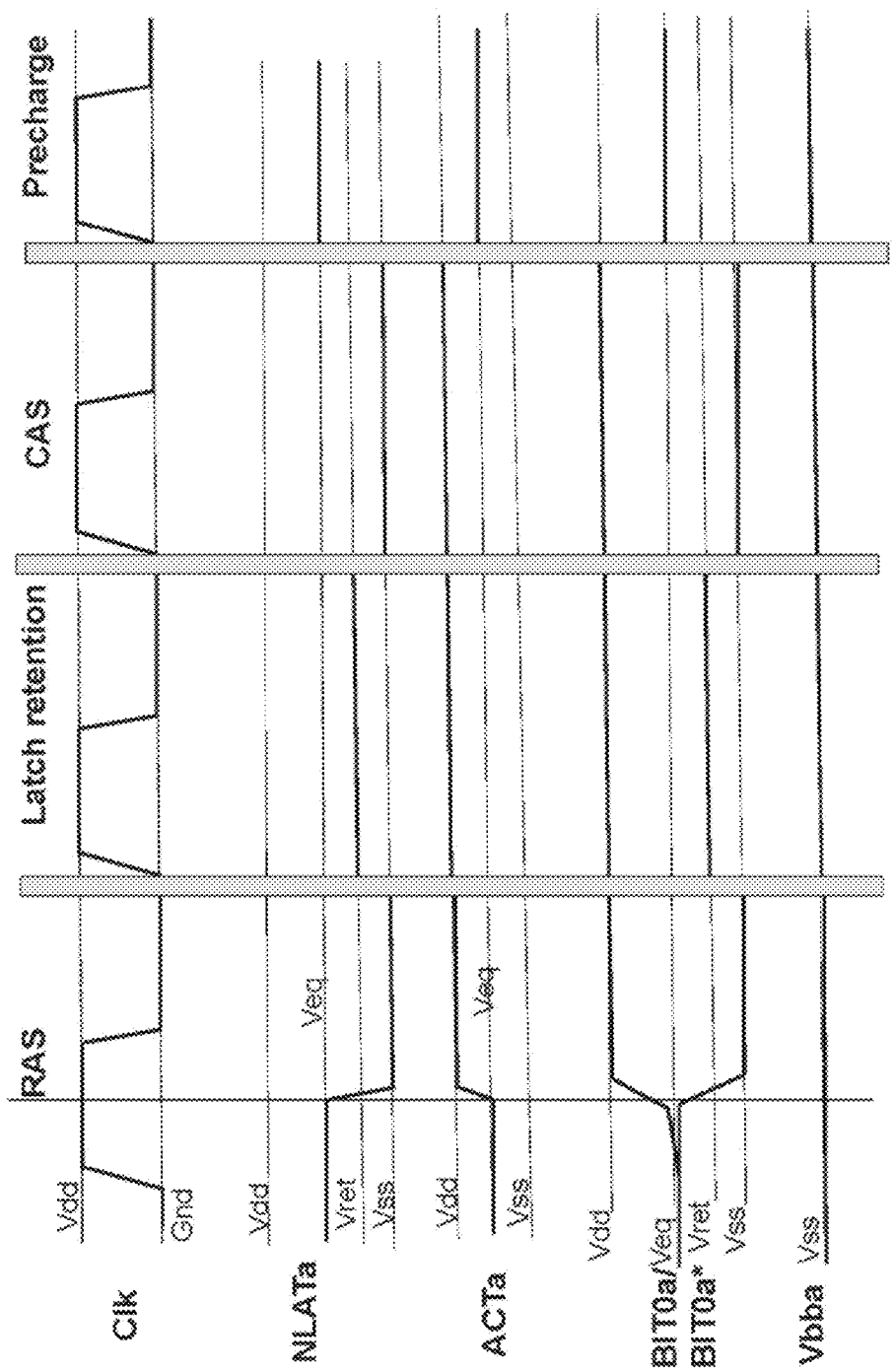
FIG. 24 is a waveform diagram of an embodiment of a method of using body bias in the context of multiple threshold voltage devices.

Referring to FIG. 24, a waveform diagram is shown to illustrate source-based bias control in NMOS to allow for multiple-purpose, multiple threshold voltage devices. The clock Clk illustrates precharge, RAS (Row Access), latch retention and CAS (Column access from the sense amp latch to the I/O lines) states. Power supply voltage Vdd and ground Gnd (also referred to as Vss) are the two voltage states for the clock. The NMOS latch NLATa (see FIG. 23) is brought up to the equilibrium voltage amount Veq during a precharge operation of the bitline. During a RAS operation, it starts at the equilibrium voltage Veq, and is switched to Vss when it is determined that the charge has been fully transferred from the bit cell to the bit line. During latch retention mode, NLATa is brought up to a retention voltage Vret which is a preselected voltage amount that allows the latch to retain the data, while minimizing leakage. During a CAS (Column Access) operation, NLATa is brought down to ground Vss. P-channel common node ACTa is held at equilibrium voltage Veq during precharge operation of the bitline, but is otherwise held at power supply voltage Vdd for RAS, CAS, and latch retention operations. Bit lines BIT0a and BIT0a* start at Veq and are moved up to Vdd and down to Vss respectively when sensing during the RAS operation. BIT0a* which holds a zero value in this embodiment is moved up to Vret approximately during latch retention phase, but is held at Vss after RAS sensing and during a CAS access. At precharge, the two bit lines are driven to equilibrium voltage Veq. The body bias applied voltage Vbba is shown in this example as being held at ground. The net result is that there is zero body bias on the cross coupled n-channels in the sense amplifier during RAS and CAS accesses, where low mismatch and high drive are required, but there is a net negative back bias during retention, due to the positive level of Vret. The higher this voltage can be driven while reliably retaining data within all sense amp latches on the chip, the lower the leakage power.

Figure 25:
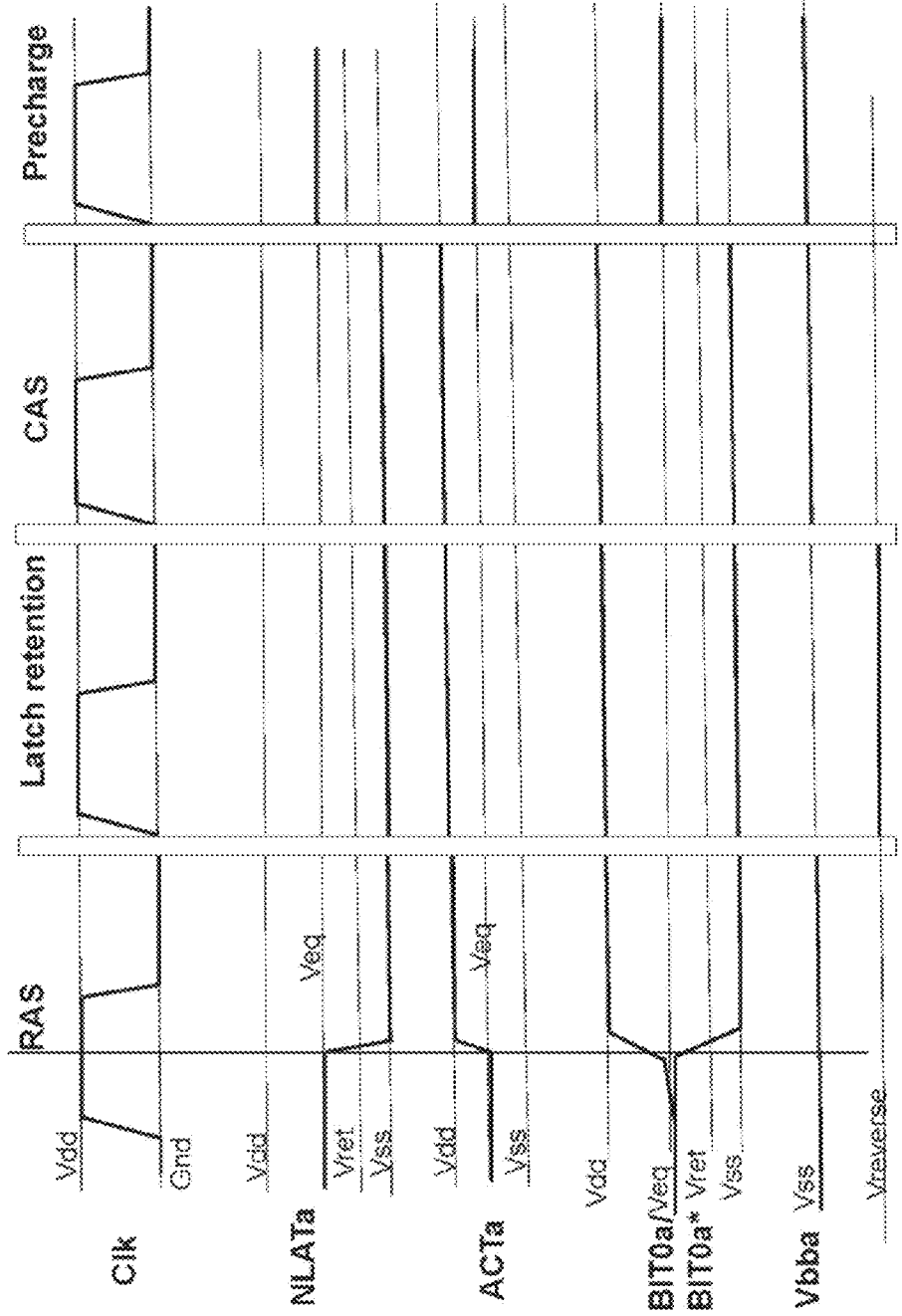
FIG. 25 is a waveform diagram of an embodiment of a method of using body bias in the context of multiple threshold voltage devices.

Referring to FIG. 25, a waveform diagram is shown to illustrate well-based bias control in NMOS to allow for multiple-purpose, multiple-threshold voltage devices. The clock Clk illustrates precharge, RAS (Row Access), latch retention, and CAS (Column access from the sense amp latch to the I/O lines) states. Power supply voltage Vdd and ground Gnd (also referred to as Vss) are the two voltage states for the clock. During a precharge operation of the bitline, Vbba is held at ground, maximizing drive of the precharge devices 840 (*a, b,* and *c*), During a RAS operation, it is also at ground Vss, maximizing drive and minimizing mismatch of the cross-coupled NMOS devices. During latch retention mode, Vbba is brought down to Vreverse, which is a preselected negative voltage amount that allows the latch to retain the data, while minimizing leakage. During a CAS (Column Access) operation, Vbba is also at ground Vss, maximizing drive and minimizing mismatch of the cross-coupled NMOS devices. P-channel common node ACTa is held at equilibrium voltage Veq during precharge operation of the bitline, but is otherwise held at power supply voltage Vdd for RAS, CAS, and latch retention operations. Bit lines BIT0a and BIT0a* start at Veq and are moved up to Vdd and down to Vss respectively when sensing during the RAS operation. BIT0a* is held at Vss after RAS sensing and during a CAS access. At precharge, the two bit lines are driven to equilibrium voltage Veq. The body bias voltage Vbba is shown in this example to operate at Vss during RAS, CAS, and precharge operations (maximizing drive of the cross-coupled NMOS devices as well as the precharge devices 840 (*a, b,* and *c*), and is driven to negative voltage Vreverse during latch retention mode. The net result is that there is zero body bias on the cross coupled n-channels in the sense amplifier during RAS and CAS accesses, where low mismatch and high drive are required, but there is a net negative back bias during retention, due to the negative level of Vret. The lower this voltage can be driven while reliably retaining data within all sense amp latches on the chip, the lower the leakage power. Note that an additional possible step can be taken where the n-well voltage of the cross coupled p-channels can also be raised during retention mode, with a triple well process (or using single or other well scheme), to minimize the p-channel portion of leakage power.

While embodiments can include DRAM integrated circuit with a DRAM array and peripheral circuits composed entirely of DDC transistors, alternate embodiments can include "hybrid" circuit implementations that use both DDC transistors and legacy transistors. For example, in a "hybrid" embodiment, DRAM peripheral circuits can include sense amplifiers that use conventional PMOS cross-couple transistors, and DDC NMOS cross-coupled transistors. Alternative embodiments can use DDC transistors to implement one or more peripheral circuits and use conventional MOSFETs to implement the other peripheral circuits. It is also noted that all of the embodiments and methods described above can be advantageously used for DRAM arrays that used either an open bit line array architecture or a folded bit line array architecture.

Embodiments can thus include DRAM integrated circuits and methods with DDC transistors having an enhanced body coefficient as compared to conventional nanoscale devices. Thus, responses of DDC transistors can vary over a wider range in response to changes in body bias voltages as compared to conventional MOSFET transistors. More specifically, the enhanced body coefficient of the DDC transistor with body bias can allow a broader range of ON-currents and OFF-current, as compared to the case where body bias voltage is applied to a conventional device.

In addition, DDC transistors can have a better threshold voltage uniformity AVT, i.e., a lower $\sigma V_T$ than conventional transistors. The lower $\sigma V_T$ can enable a lower minimum operating voltage (VDD) and a wider range of available nominal values of $V_T$.

The screening region of DDC transistors can enable effective body biasing for enhanced control of the operating conditions of a device (e.g., transistor) or a group of devices to be set by controlling the applied body bias voltage. In addition, different operating conditions can be set for devices or groups of devices as result of applying different body bias voltages.

In one embodiment, the body bias voltage of the DRAM can be set to provide a target performance for the DRAM arrays, with the same bias voltage applied to the peripheral circuits. In such embodiments, the screening region doping concentration would be adjusted to provide a target performance of the DRAM sense amplifier when the body bias voltage is applied to DDC transistors (i.e., the screening region doping concentration is set to provide a target threshold voltage for DDC transistors in the DRAM sense amplifier based on the body bias of the array). The screening region doping concentrations of the DDC transistors for the other DRAM peripheral circuits can also be similarly adjusted to provide a target performance when the body bias voltage is applied to these circuits.

DRAM wafers and die supporting multiple transistor types, including those with and without the described dopant layers and structures are contemplated. Integrated circuits that include the disclosed DRAM circuits, or are manufactured in accordance with the disclosed processes or other processes, can be incorporated (e.g., embedded) into chip products such as "systems on a chip" (SoC), advanced microprocessors, radio frequency, other types of memory, and other die with one or more digital and analog transistor configurations, and are capable of supporting a wide range of applications, including wireless telephones, communication products, "smart phones", embedded computers, portable computers, personal computers, servers, and other electronic products. Body biasing can be used to enable reduced power or higher performance operation of various integrated circuits including DRAM integrated circuits. For instance, forward body bias (FBB) can be useful for particular devices, with the option of removing the FBB when the devices are in a low power state.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A dynamic random access memory (DRAM), comprising:
    at least one DRAM cell array, comprising a plurality of DRAM cells, each including a storage capacitor and access transistor;
    a body bias control circuit configured to generate a body bias voltage from a bias supply voltage, the body bias voltage being different from a power supply voltage of the DRAM; and
    peripheral circuits formed in the same substrate as the at least one DRAM cell array, the peripheral circuits having at least one deeply depleted channel (DDC) transistor having a body coupled to receive the body bias voltage, the DDC transistor having a screening region of a first conductivity type formed below a substantially undoped channel region, the screening region having a first dopant concentration that is no less than $1 \times 10^{18}$ dopant atoms/cm$^3$ and that is different from a second dopant concentration of a substrate portion or well containing the DDC transistor; wherein:
    the peripheral circuits comprise a digital delay line circuit including at least a fine delay circuit having a plurality of delay stages arranged in series, each delay stage including DDC transistors; and
    the body bias control circuit is a delay control circuit configured to apply different body biases to the DDC transistors of the delay stages in response to a delay set value.

2. The DRAM of claim 1, wherein:
    the body bias control circuit comprises a digital-to-analog converter (DAC) and the delay set value comprises a digital value input to the (DAC).

3. The DRAM of claim 1, wherein:
    the digital delay line circuit further includes
    a coarse delay circuit configured to introduce any of a plurality of coarse delays into an input signal, and
    the fine delay circuit introduces any of a plurality of fine delays into the input signal; wherein
    the coarse delays have a same first duration, the fine delays have a same second duration, and the coarse delays consist of N fine delays, where N is an integer greater than one.

* * * * *